(12) United States Patent
Ueda et al.

(10) Patent No.: US 7,396,571 B2
(45) Date of Patent: Jul. 8, 2008

(54) POLYMERIC FLUORESCENT SUBSTANCE AND POLYMER LIGHT-EMITTING DEVICE

(75) Inventors: Masato Ueda, Tsukuba (JP); Takanobu Noguchi, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 0 days.

(21) Appl. No.: 11/819,586

(22) Filed: Jun. 28, 2007

(65) Prior Publication Data

US 2007/0248842 A1      Oct. 25, 2007

Related U.S. Application Data

(62) Division of application No. 10/456,841, filed on Jun. 9, 2003, now Pat. No. 7,256,245, which is a division of application No. 09/754,297, filed on Jan. 5, 2001, now Pat. No. 6,602,969.

(30) Foreign Application Priority Data

| Jan. 12, 2000 | (JP) | ............................... 2000-003567 |
| May 16, 2000 | (JP) | ............................... 2000-143050 |
| Aug. 29, 2000 | (JP) | ............................... 2000-258642 |

(51) Int. Cl.
*C09K 19/00* (2006.01)

(52) U.S. Cl. ..................... 428/1.2; 428/1.3; 428/1.33; 428/461; 428/462

(58) Field of Classification Search .................. 428/1.2, 428/1.3, 1.33, 461, 462
See application file for complete search history.

(56) References Cited

U.S. PATENT DOCUMENTS

| 5,247,190 | A | 9/1993 | Friend et al. |
| 5,254,633 | A | 10/1993 | Han |
| 5,731,599 | A | 3/1998 | Hwang et al. |
| 5,777,070 | A | 7/1998 | Inbasekaran |
| 5,807,974 | A | 9/1998 | Kim et al. |
| 5,883,684 | A | 3/1999 | Millikan et al. |
| 5,909,038 | A | 6/1999 | Hwang et al. |
| 5,945,502 | A | 8/1999 | Hsich et al. |

FOREIGN PATENT DOCUMENTS

| DE | 19505416 A1 | 8/1996 |
| EP | 0 637 621 B1 | 2/1995 |
| EP | 0672741 A1 | 9/1995 |
| EP | 0725120 A1 | 8/1996 |
| EP | 0786924 A1 | 7/1997 |
| EP | 0825242 A2 | 2/1998 |
| EP | 0964045 A1 | 12/1999 |
| JP | 6-36877 | 2/1994 |
| WO | WO 94/20589 A2 | 9/1994 |
| WO | WO 96/29356 A2 | 9/1996 |
| WO | WO 99/20711 A1 | 4/1999 |
| WO | WO 00/46321 A1 | 8/2000 |

OTHER PUBLICATIONS

Patent Abstract of Japan vol. 1999, No. 3, Mar. 31, 1999; JP 10 324870A (Sumitomo Chem. Co. Ltd.), Dec. 8, 1998 Abstract.

Patent Abstract of Japan vol. 16, No. 33 (C-0905), Jan. 28, 1992, JP 03 244630A (Sumitomo Chem. Co. Ltd.) Oct. 31, 1991., Abstract.

Patent Abstract of Japan, vol. 14. No. 509 (C-0776), & JP 02 209988A (Idemitsu Kosan Co. Ltd.), Aug. 21, 1990, Abstract.

Yamamoto, T. et al. "Preparation and Properties of PI-Conjugated Poly(benzimidazole-4,7-diyl)" Macromolecular Chemistry and Physics, Wiley VCH, Weinheim, DE , vol. 199, No. 9, Sep. 1998 pp. 1807-1813; XP000785721 ISSN: 1022-1352.

Peng Z. et al. "Oxadiazole-containing conjugated polymers for light-emitting diodes" Advanced Materials, VCH Verlagsgesellschaft, Weinheim, DE, vol. 10, No. 9, Jun. 18, 1998 pp. 680-684, XP000774672 ISSN: 0935-9648.

Yamamoto, T. et al., "Polymer light-emitting diodes with single-and double-layer structures using poly(2,3-diphenylquinoxaline-5,8-diyl)" Japanese Journal of Applied Physics, Publication Office Japanese Journal of Applied Physics, Tokyo, JP, vol. 33, No. 2B Part 2, Feb. 15, 1994, pp. L250-L253, XP000595019 ISSN: 0021-4922.

Janietz, S. et al. "Synthesis of New Thianthrene containing polymers and aromatic poly(oxadiazoles) and their application in OLEDS" Polymer preprints, American Chemical Society, U.S., vol. 40, 1999, pp. 1219-1220, XP001061912, ISSN: 0032-3934.

Yamamoto, T. et al., "Conjugated poly(pyridine-2-5-diyl), poly(2,2'-bipyridine-5-'-diyl), and their alkyl derivatives. Preparation, linear structure, function as a ligand to form their transition metal complexes, catalytic reactions, n-type electrically conducting properties, optical properties, and Alignment On substrat" Journal of American Chemical Society, American Chemical Society, Washington, D.C., US, vol. 116, 1994, pp. 4832-4845, XP002201577, ISSN: 0002-7863.

Huang, W. et al., "A new blue light-emitting polymer containing substituted thiophene and an arylene-1,3,5-oxadiazole moiety" Advance Mateirals, VCH, Verlagsgesellschaft, Weinheim, DE, vol. 10, No. 8, Jun. 2, 1998, pp. 593-596, XP000766724, ISSN 0935-9648.

Li, X. C., et al., "Synthesis, Properties, and Application of new luminescent polymers with both hole and electron injection abilities for light-emitting devices" Chemistry of Materials, American Chemical Society, Washington, D.C., US, vol. 11, No. 6, Jun. 1999, pp. 1568-1575, XP000865219, ISSN: 0897-4756.

Hwang, D. H. et al., "New Luminescent Polymers for LEDS and LECS" Macromolecular Symposia, Wiley VCH, Weinheim, DE, vol. 125, No. 125, 1997, pp. 111-120, XP000907043, ISSN: 1022-1360.

(Continued)

*Primary Examiner*—Bernard Lipman
(74) *Attorney, Agent, or Firm*—Sughrue Mion, PLLC

(57) ABSTRACT

Provided is a polymeric fluorescent substance showing fluorescence in solid state, which has a specific carrier drift mobility, a specific repeating unit, and specific number-average molecular weight. The polymeric fluorescent substance is excellent in solubility to organic solvents, and has higher efficiency and longer lifetime in applying as a polymer LED.

5 Claims, No Drawings

OTHER PUBLICATIONS

Takakazu, Yamamoto et al., "Preparation of Conjugated poly(thiophene-2,5-Diyl), poly(P-Phenylene), and related polymers using Zerovalent nickel complexes. Linear structure and perperties of the conjugated polymers" Macromolecules, American Chemical Society. Easton, NJ., US, vol. 25, No. 4, Feb. 17, 1992, pp. 1214-1223, XP000257555, ISSN: 0024-9297.

D. Hwang et al., Green light-emitting diodes from poly(2-dimethyloctylsilyl-1,4-phenylenevinylene), Chem. Commun., (1996), pp. 2241-2242.

B. Chuah et al., "New luminescent polymers for LED's", Synthetic Metals 91, (1997), pp. 279-282 with Abstract.

D. Hwang et al., "Highly efficient green light-emitting diodes with aluminum cathode", Synthetic Metals 84, (1997), pp. 615-618 with Abstract.

POLYMERIC FLUORESCENT SUBSTANCE AND POLYMER LIGHT-EMITTING DEVICE

This is a divisional of application Ser. No. 10/456,841 filed Jun. 9, 2003, now U.S. Pat. No. 7,256,245, which is a Divisional Application of U.S. application Ser. No. 09/754,297 filed Jan. 5, 2001 now issued as U.S. Pat. No. 6,602,969. The entire disclosures of the prior applications, application numbers 10/456,841 and 09/754,297 are hereby incorporated by reference.

BACKGROUND OF THE INVENTION

1. Field of the Invention

The present invention relates to a polymeric fluorescent substance, a polymer light-emitting device (hereinafter, referred to as polymer LED), and a device using the same.

2. Description of the Related Art

Inorganic electroluminescence devices (hereinafter, sometimes referred to as inorganic EL device) using an inorganic luminescent material as a light-emitting material are used for example for sheet light sources as back-lights and displays such as a flat panel display and the like, however, an alternating current of high voltage has been required for light emission.

Recently, there has been reported an organic electroluminescence device (hereinafter, sometimes referred to as organic EL device) having a double-layer structure in which an organic fluorescent dye as a light-emitting layer is laminated with an organic charge transport compound used in photosensitive layer for electrophotography and the like (Japanese Patent Application Laid-Open (JP-A) No. 59-194393). Since organic EL devices have characteristics that light emissions of a lot of colors are obtained easily in addition to low voltage driving and high luminance as compared with inorganic EL devices, there have been reported a lot of trials regarding device structures, organic fluorescent dyes and organic charge transport compounds of organic EL devices [Jpn. J. Appl. Phys., 27, L269 (1988), J. Appl. Phys., 65, 3610 (1989)].

Further, apart from organic EL devices using mainly organic compounds having a lower molecular weight, polymer light-emitting devices using light-emitting materials having a higher molecular weight have been proposed in such as WO 9013148 published specification, JP-A No. 3-244630, Appl. Phys. Lett., 58, 1982 (1991). WO9013148 discloses in the Examples an EL device using a thin film of poly(p-phenylene vinylene) obtained by forming a film of a soluble precursor on the electrode and subjecting it to a heat treatment to convert the precursor into a conjugated polymer.

Further, JP-A 3-244630 has exemplified a conjugated polymers having a feature that they are themselves soluble in a solvent and needs no heat treatment. Also in Appl. Phys. Lett., 58, 1982 (1991), a polymeric light-emitting materials soluble in a solvent and a polymer LED fabricated using the same are described.

Polymer LEDs are advantageous for formation of a film having large area and reduction in cost since an organic layer can be easily formed by coating with using a polymeric fluorescent substance soluble in organic solvents, as compared with the case of vapor deposition of a material having a lower molecular weight, and the mechanical strength of the resulting film is believed to be high because of a high molecular weight thereof.

Conventionally, as the light-emitting materials used in these polymer LEDs, in addition to the above-described poly (p-phenylene vinylene), there have been reported polyfluorene (Jpn. J. Appl. Phys., 30, L1941 (1991)), poly p-phenylene derivative (Adv. Mater., 4, 36 (1992)) and the like.

In order to utilize the film-formable characteristics of a polymeric fluorescent substance by coating, there have been demanded a polymeric fluorescent substance having excellent solubility in organic solvents. To realize the practical falt panel display, there have been demanded a polymer LED having high efficiency and long.

The object of the present invention is to provide a polymeric fluorescent substance having more excellent solubility to organic solvents, a polymer LED having high performance which can be driven at high efficiency and longer lifetime using said polymeric fluorescent substance.

SUMMARY OF THE INVENTION

As a result of intensive studies, the present inventors have found that a polymeric fluorescent substance having a specific carrier drift mobility and a specific repeating unit is more excellent in solubility to organic solvents, and has higher efficiency and longer lifetime in applying as a polymer LED, and reached to the completion of the present invention.

Namely, the present invention relates to [1] a polymer fluorescent substance which emits fluorescence in solid state, has a number-average molecular weight in terms of polystyrene of $1 \times 10^4$ to $1 \times 10^8$, has at least one repeating unit of the following general formula (1) and in which the ratio of the hole drift mobility $\mu_H$ to the electron drift mobility $\mu_E$ of said polymer fluorescent substance is from 0.1 to 10:

(1)

[in the formula, $Ar_1$ is an arylene group having 6 to 60 carbon atoms contained in the main chain portion or a divalent heterocyclic compound group having 3 to 60 carbon atoms contained in the main chain portion].

Moreover, the present invention relates to [2] a polymer fluorescent substance which emits fluorescence in solid state, has a number-average molecular weight in terms of polystyrene of $1 \times 10^4$ to $1 \times 10^8$, and has each of the repeating units represented by the formulae (2), (3) and (4):

(2)

[in the formula, $Ar_2$ is an arylene group having 6 to 60 carbon atoms contained in the main chain portion or a divalent heterocyclic compound group having 3 to 60 carbon atoms contained in the main chain portion],

(3)

[in the formula, $Ar_3$ is an arylene group having 6 to 60 carbon atoms contained in the main chain portion or a heterocyclic compound group having 3 to 60 carbon atoms contained in the main chain portion.],

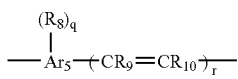

(4)

[in the formula, $Ar_5$ is an arylene group having 6 to 60 carbon atoms contained in the main chain portion or a divalent heterocyclic compound group having 3 to 60 carbon atoms contained in the main chain portion].

Moreover, the present invention relates to [3] a polymer light-emitting device comprising at least one light-emitting layer containing a polymer fluorescent substance, placed between a pair of an anode and a cathode at least one of which is transparent or semi-transparent, wherein, the light-emitting layer contains a polymer fluorescent substance of above described [1] or [2].

Further, the present invention relates to [4] a sheet light source using a polymer light-emitting device of above described [3].

Next, the present invention relates to [5] a segment display apparatus using a polymer light-emitting device of above described [3].

Next, the present invention relates to [6] a dot matrix display apparatus using a polymer light-emitting device of above described [3].

And, the present invention relates to [7] a liquid crystal display apparatus using a polymer light-emitting device of above described [3].

DETAILED DESCRIPTION OF THE INVENTION

The polymeric fluorescent substance and a polymer LED using the same will be described in detail below.

The polymeric fluorescent substance of the present invention is a polymeric fluorescent substance which emits a fluorescence in solid state and having a number-average molecular weight of $1 \times 10^4$ to $1 \times 10^8$ in terms of polystyrene, wherein the substance contains at least one repeating unit represented by the above-described formula (1). More preferably the substance contains each one or more of repeating units represented by the above-described formula (2), formula (3) or formula (4), respectively.

In the above formula (1), $Ar_1$ is a divalent group forming carbon-carbon bonds with adjacent two groups respectively, the divalent group being an arylene group having 6 to 60 carbon atoms participating in conjugation or a heterocyclic compound group having 3 to 60 carbon atoms participating in conjugation, and the arylene group and heterocyclic compound group may further have a substituent. Each of $R_1$ and $R_2$ independently represents a group selected from the group consisting of a hydrogen atom, linear, branched or cyclic alkyl groups having 1 to 20 carbon atoms, aryl groups having 6 to 60 carbon atoms, heterocyclic compound groups having 3 to 60 carbon atoms and a cyano group, and the aryl group and heterocyclic compound group may further have a substituent. The symbol j is 0 or 1.

In the above formula (2), $Ar_2$ is an arylene group having 6 to 60 carbon atoms contained in the main chain portion or a divalent heterocyclic compound group having 3 to 60 carbon atoms contained in the main chain portion. $R_3$ represents a group selected from the group consisting of linear, branched or cyclic alkyl groups having 1 to 20 carbon atoms, mono, di or trialkylsilyl groups having 1 to 60 carbon atoms, aryl groups having 6 to 60 carbon atoms, arylalkyl groups having 7 to 60 carbon atoms and heterocyclic compound groups having 3 to 60 carbon atoms, and the aryl group, arylalkyl group and heterocyclic group may also have a substituent. X represents a group selected from —O—, —S—, —$CR_{11}R_{12}$—, —$SiR_{13}R_{14}$—, —$NR_{15}$—, —CO—, —COO—, —$SO_2$—, —$CR_{16}$=$CR_{17}$—, and —C≡C—. The symbol k is an integer from 1 to 4. $R_4$, $R_5$, and $R_{11}$-$R_{17}$ represent, each independently, a group selected from the group consisting of a hydrogen atom, linear, branched or cyclic alkyl groups having 1 to 20 carbon atoms, aryl groups having 6 to 60 carbon atoms, heterocyclic compound groups having 3 to 60 carbon atoms and a cyano group, and the aryl group and heterocyclic group may also have a substituent. The symbol m is 0 or 1.

Here, $Ar_2$ may have a substituent selected from the group consisting of linear, branched or cyclic alkyl groups having 1 to 20 carbon atoms, mono, di or trialkylsilyl groups having 1 to 60 carbon atoms, mono or dialkylamino groups having 1 to 40 carbon atoms, aryl groups having 6 to 60 carbon atoms, arylalkyl groups having 7 to 60 carbon atoms, arylamino groups having 6 to 60 carbon atoms, heterocyclic compound groups having 3 to 60 carbon atoms and a cyano group, and the aryl group, arylalkyl group, arylamino group and heterocyclic group may further have a substituent. When $Ar_2$ has a plurality of substituents, they may be the same or different. One or more carbon atoms of the substituent on $Ar_2$ may be substituted with an oxygen atom or sulfur atom, and one or more hydrogen atoms of the substituent on $Ar_2$ may be substituted with a fluorine atom.

In the above formula (3), $Ar_3$ is an arylene group having 6 to 60 carbon atoms contained in the main chain portion or a heterocyclic compound group having 3 to 60 carbon atoms contained in the main chain portion. $Ar_4$ is an aryl group having 6 to 60 carbon atoms or a heterocyclic compound group having 3 to 60 carbon atoms, and may also have a substituent selected from the group consisting of linear, branched or cyclic alkyl groups having 1 to 20 carbon atoms, alkoxy groups having a linear, branched or cyclic alkyl group having 1 to 20 carbon atoms, alkylthio groups having a linear, branched or cyclic alkyl group having 1 to 20 carbon atoms, mono, di or trialkylsilyl groups having 1 to 60 carbon atoms, mono or dialkylamino groups having 1 to 40 carbon atoms, aryl groups having 6 to 60 carbon atoms, aryloxy groups having 6 to 60 carbon atoms, arylalkyl groups having 7 to 60 carbon atoms, arylalkoxy groups having 7 to 60 carbon atoms, arylalkenyl groups having 8 to 60 carbon atoms, arylalkynyl groups having 8 to 60 carbon atoms, arylamino groups having 6 to 60 carbon atoms, heterocyclic compound groups having 3 to 60 carbon atoms and a cyano group, and the aryl group, aryloxy group, arylalkyl group, arylalkoxy group, arylalkenyl group, arylalkynyl group, arylamino group and heterocyclic group may further have a substituent. The symbol n is an integer from 1 to 4. Each of $R_6$ and $R_7$ independently represents a group selected from the group consisting of a hydrogen atom, linear, branched or cyclic alkyl groups having 1 to 20 carbon atoms, aryl groups having 6 to 60 carbon atoms, heterocyclic compound groups having 3 to 60 carbon atoms and a cyano group, and the aryl group and heterocyclic group may also have a substituent. The symbol p is 0 or 1. $Ar_3$ may have a substituent selected from the group consisting of linear, branched or cyclic alkyl groups having 1 to 20 carbon atoms, alkoxy groups having a linear; branched or cyclic alkyl group having 1 to 20 carbon atoms, alkylthio groups having a linear, branched or cyclic alkyl group having 1 to 20 carbon atoms, mono, di or trialkylsilyl groups having 1 to 60 carbon atoms, mono or dialkylamino groups having 1 to 40 carbon atoms, aryloxy groups having 6 to 60 carbon atoms, arylalkyl groups having 7 to 60 carbon atoms, arylalkoxy groups having 7 to 60 carbon atoms, arylamino groups having 6 to 60 carbon atoms, and a cyano group, and the aryloxy group, arylalkyl group, arylalkoxy group, arylamino group may further have a substituent. When $Ar_3$ has a plurality of substituents, they may be the same or different. One or more carbon atoms of the substituents on $Ar_3$ may be substituted with an oxygen atom or sulfur atom, and one or more hydrogen atoms of the substituents on $Ar_3$ may be substituted with a fluorine atom.

In the above formula (4), $Ar_5$ is an arylene group having 6 to 60-carbon atoms contained in the main chain portion or a divalent heterocyclic compound group having 3 to 60 carbon atoms contained in the main chain portion. $R_8$ represents a group selected from the group consisting of linear, branched or cyclic alkyl groups having 1 to 20 carbon atoms, mono, di or trialkylsilyl groups having 1 to 60 carbon atoms, mono or dialkylamino groups having 1 to 40 carbon atoms, saturated heterocyclic compound groups having 3 to 60 carbon atoms and arylalkyl groups having 7 to 60 carbon atoms, and the arylalkyl group may further have a substituent. The symbol q is an integer from 1 to 4. Each of $R_9$ and $R_{10}$ independently represents a group selected from the group consisting of a hydrogen atom, linear, branched or cyclic alkyl groups having 1 to 20 carbon atoms, aryl groups having 6 to 60 carbon atoms, heterocyclic compound groups having 3 to 60 carbon atoms and a cyano group, and the aryl group and heterocyclic group may also have a substituent. The symbol r is 0 or 1. $Ar_5$ may have a substituent selected from the group consisting of alkoxy groups having a linear, branched or cyclic alkyl group having 1 to 20 carbon atoms, alkylthio groups having a linear, branched or cyclic alkyl group having 1 to 20 carbon atoms, aryl groups having 6 to 60 carbon atoms, aryloxy groups having 6 to 60 carbon atoms, arylalkoxy groups having 7 to 60 carbon atoms, arylamino groups having 6 to 60 carbon atoms, heterocyclic compound groups having 3 to 60 carbon atoms and a cyano group, and the aryl group, aryloxy group, arylalkoxy group, arylamino group and heterocyclic group may further have a substituent. When $Ar_5$ has a plurality of substituents, they may be the same or different. One or more carbon atoms of the substituents on $Ar_5$ may be substituted with an oxygen atom or sulfur atom, and one or more hydrogen atoms of the substituents on $Ar_5$ may be substituted with a fluorine atom.

In the polymer fluorescent substance of the present invention, containing each of the repeating units represented by repeating units of the formulae (2), (3) and (4) respectively, the total amount of repeating units of the formulae (2), (3) and (4) is, preferably, 50 mol % or more based on all repeating units, and the amount of repeating units of the formula (2) is 0.1 mol % to 30 mol %, the amount of repeating units of the formula (3) is 29.9 mol % to 70 mol % and the amount of repeating units of the formula (4) is 29.9 mol % to 70 mol %, based on the total amount of repeating units of the formulae (2), (3) and (4).

The amount of repeating units of the formula (2) is, more preferably, 0.2 mol % to 20 mol %, and further preferably, 1 mol % to 10 mol %, based on the total amount of repeating units of the formulae (2), (3) and (4).

In the formula (2), $Ar_2$, preferably, is an arylene group having 6 to 20 carbon atoms contained in the main chain and X is an oxygen atom, in the formula (3), $Ar_3$ is an arylene group having 6 to 20 carbon atoms contained in the main chain, and more preferably, in the formula (4), $Ar_5$ is an arylene group having 6 to 20 carbon atoms contained in the main chain.

In the formula (4), $R_8$ is, preferably, a mono, di or trialkylsilyl group having 1 to 60 carbon atoms.

Further preferably, the polymer fluorescent substance comprising at least four repeating units of the formulae (2), (3) and (4).

In the formulas (1) to (4), $Ar_1$, $Ar_2$, $Ar_3$, and $Ar_5$ are, respectively, an arylene group having 6 to 20 carbon atoms contained in the main chain or a heterocyclic compound group having 2 to 20 carbon atoms contained in the main chain.

$Ar_1$, $Ar_2$, $Ar_3$, and $Ar_5$ can be selected so as not to deteriorate the fluorescence property of the polymer fluorescent substance, and exemplified are divalent groups below described chemical formulas 7 to 20.

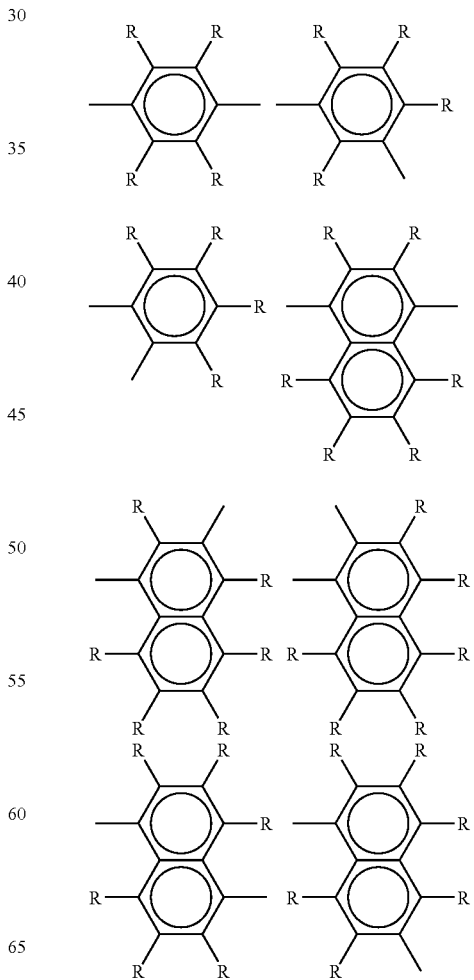

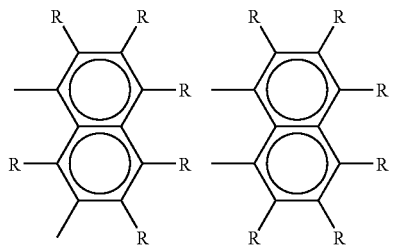
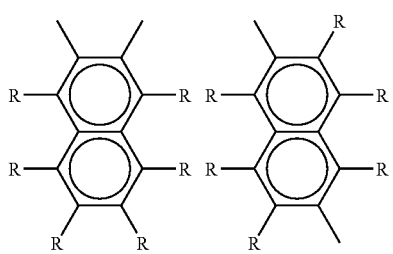
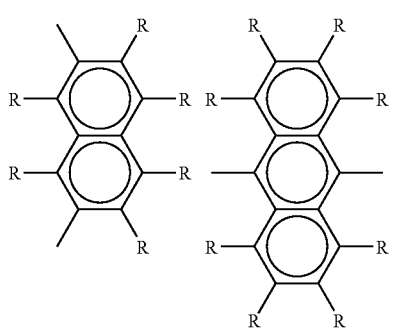
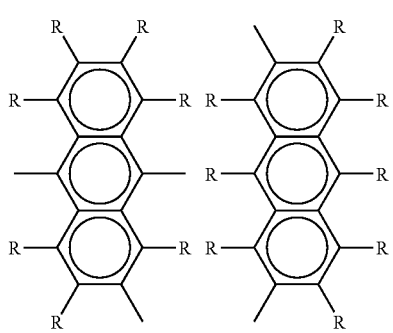
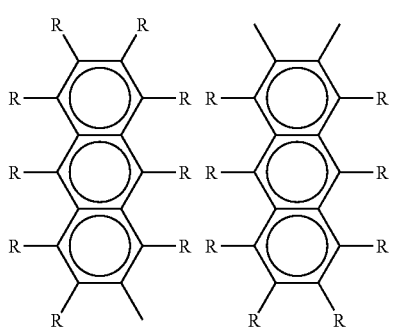
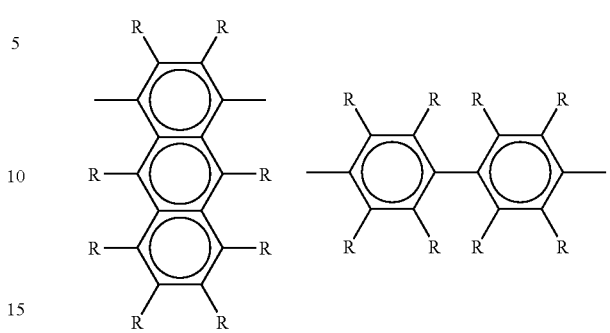
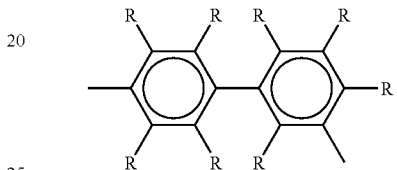
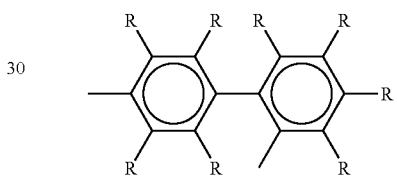
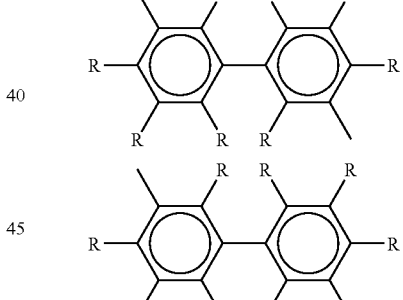
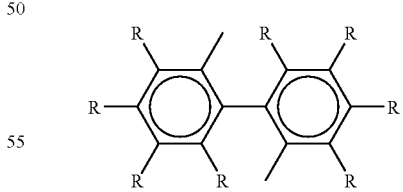
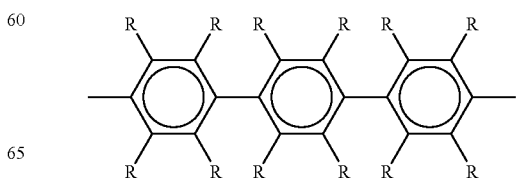

-continued
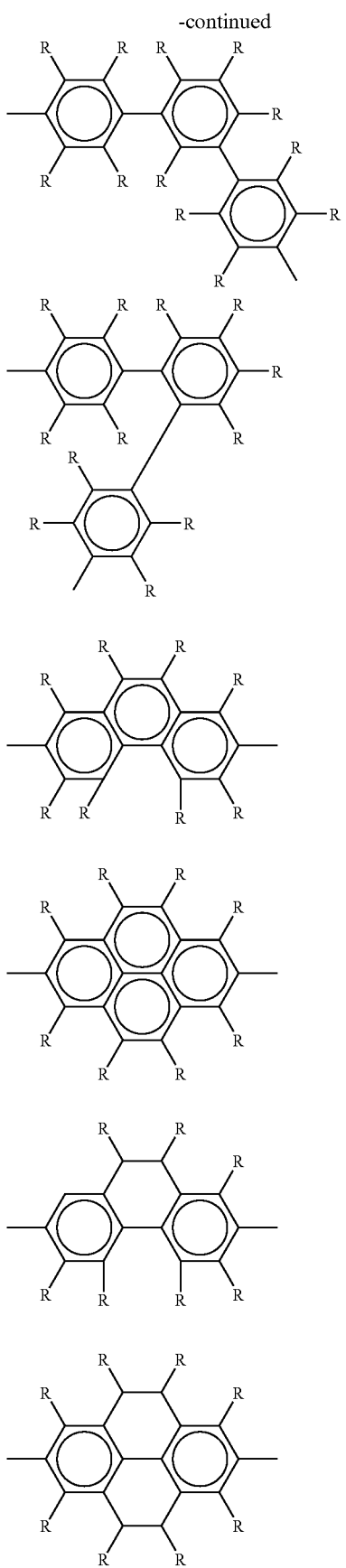
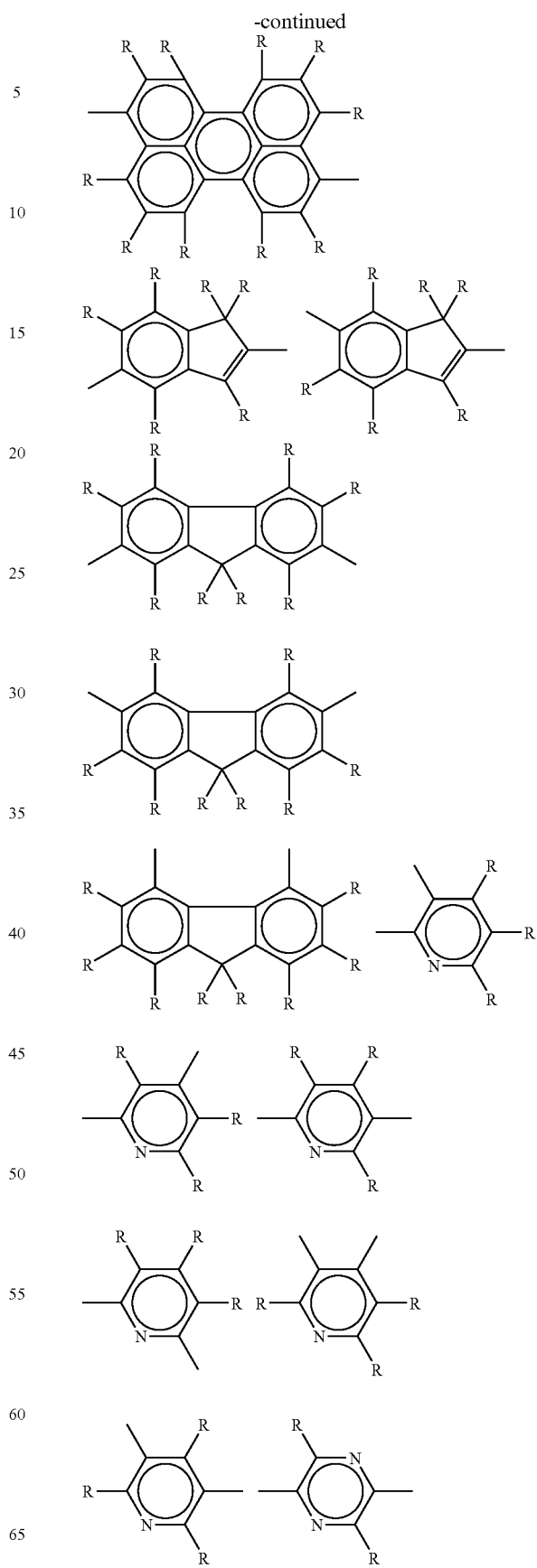

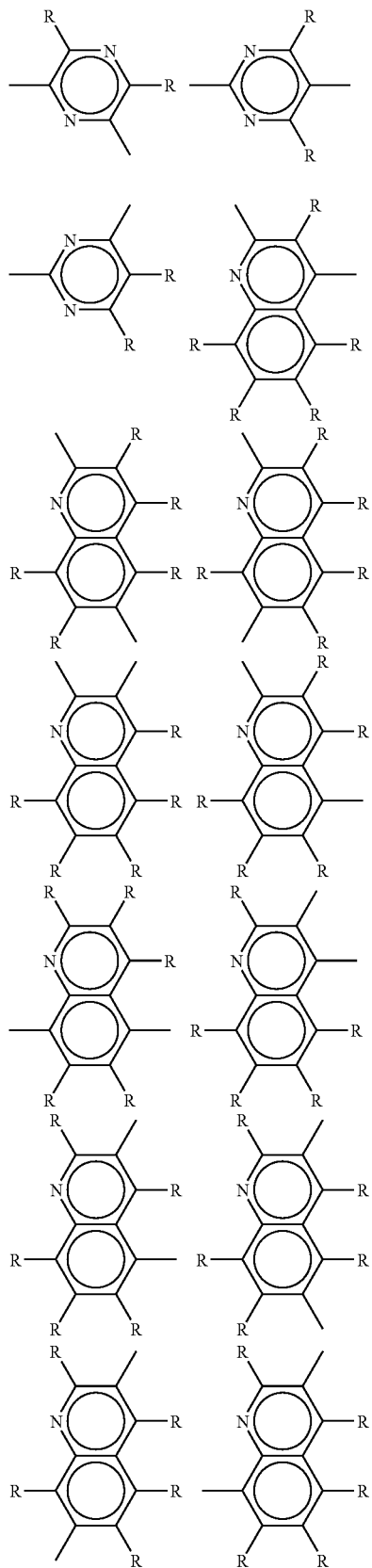
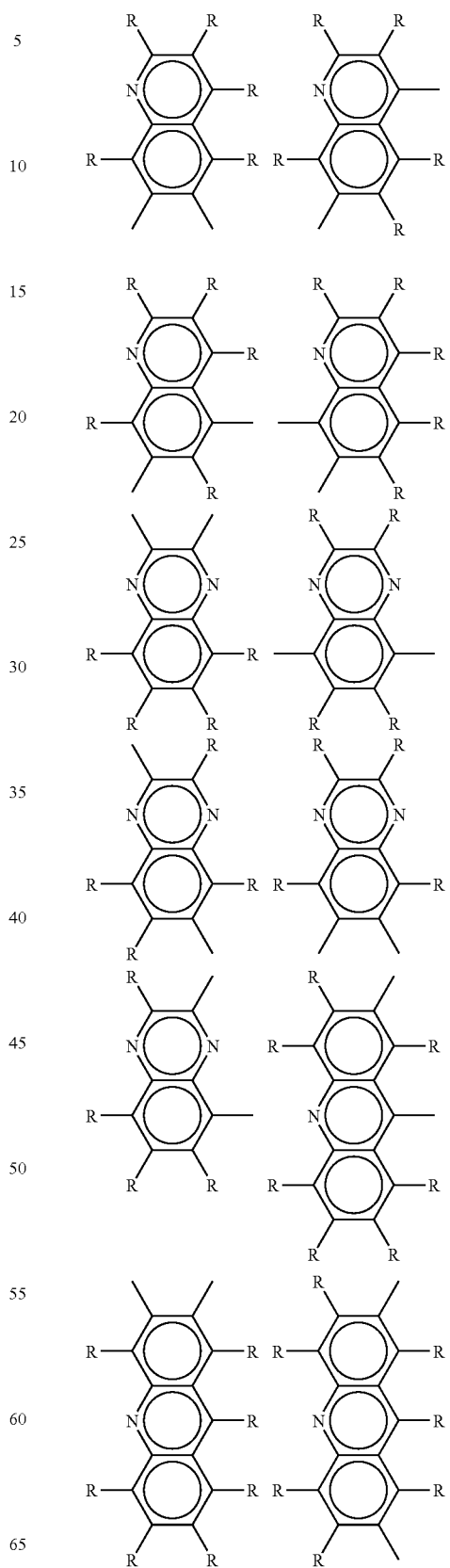

-continued
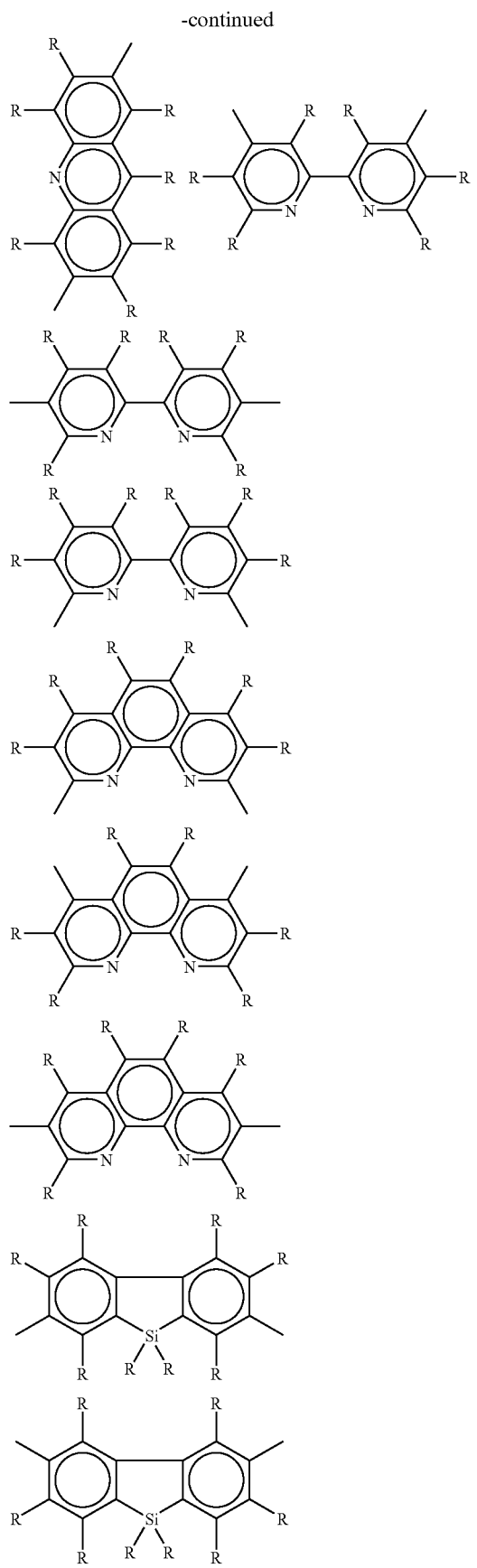
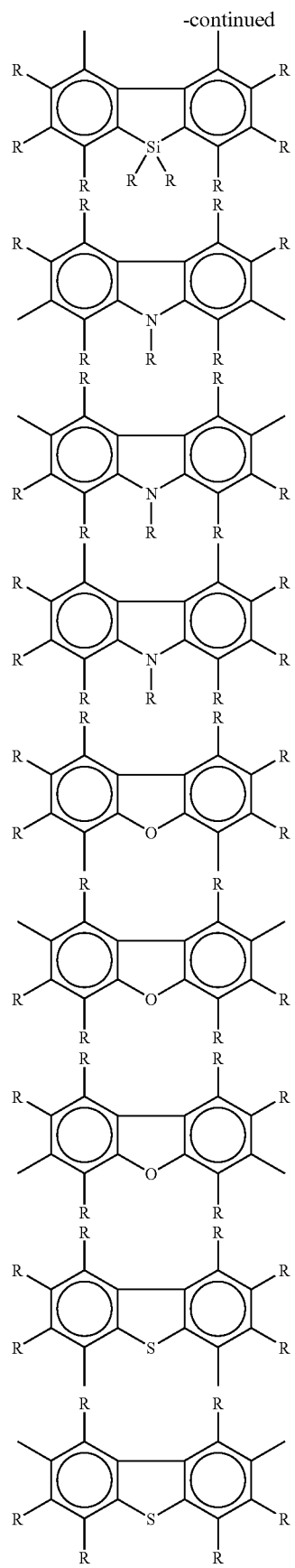

-continued
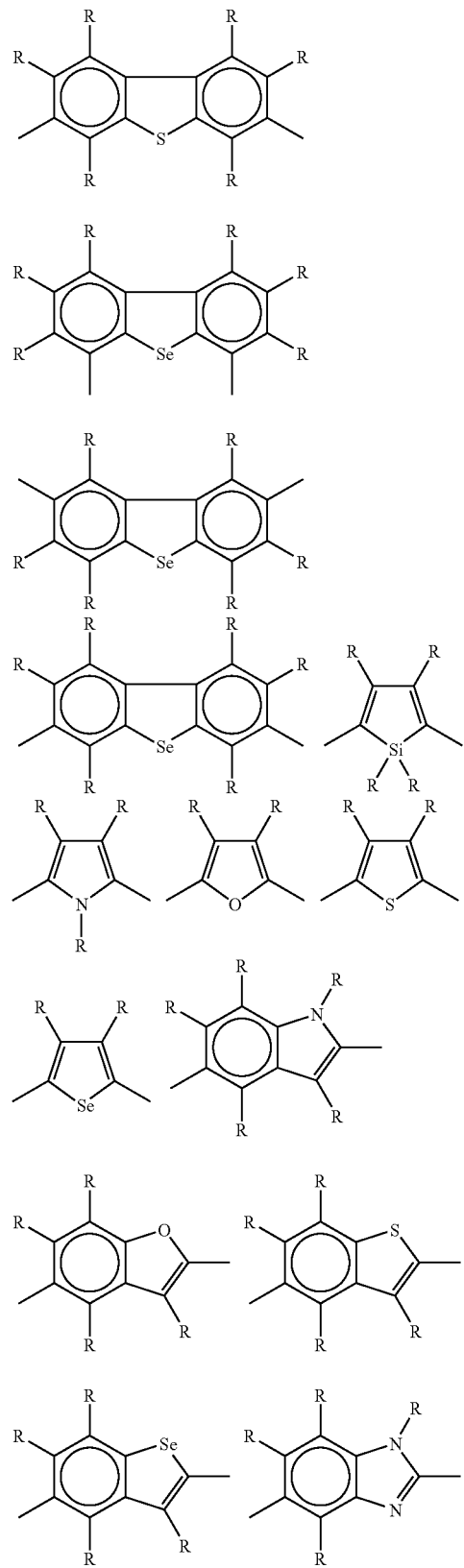
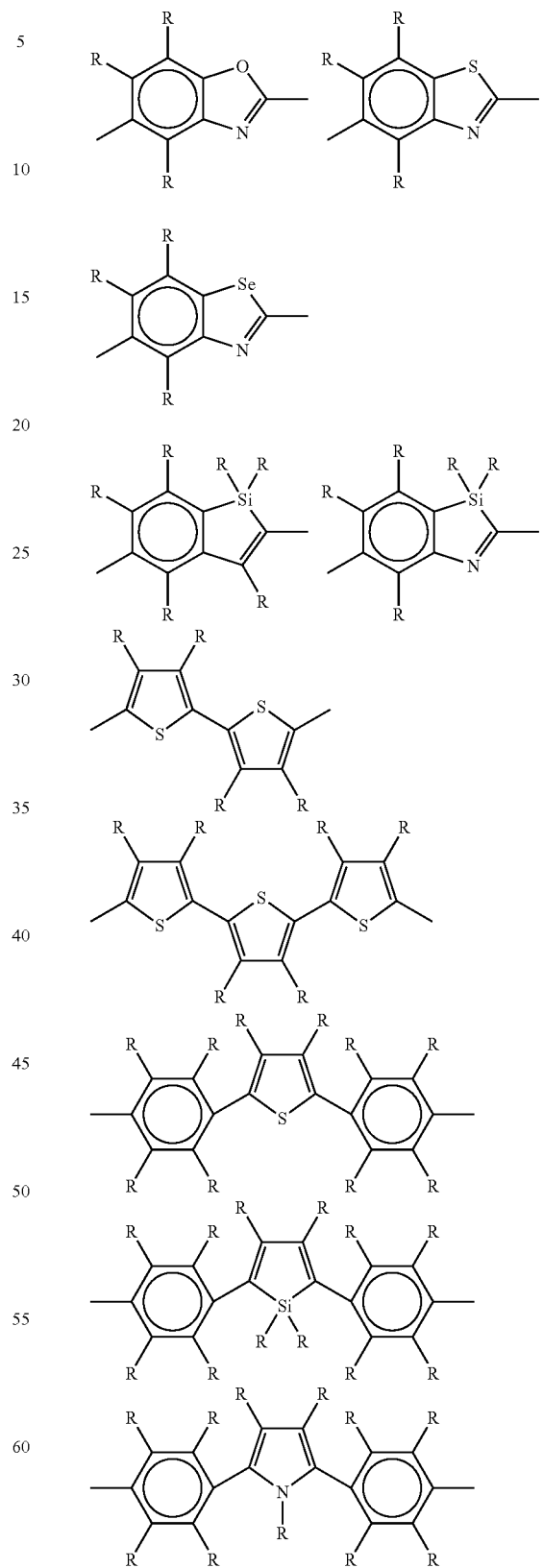

-continued

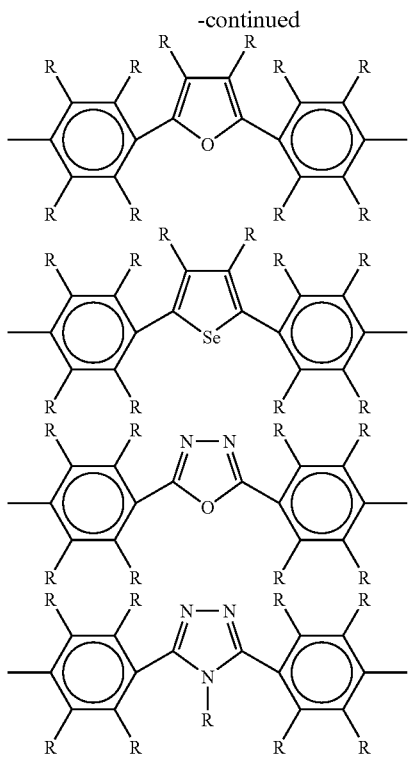

In the above examples of Ar$_2$, Ar$_3$ and Ar$_5$, R is selected: to have 1 to 4 substituent groups represented by —X—R$_3$, in case of Ar$_2$; to have 1 to 4 substituent groups represented by Ar$_4$, in case of Ar$_3$; to have 1 to 4 substituent groups represented by R$_8$, in case of Ar$_5$.

R other than the groups represented by —X—R$_3$, —Ar$_4$ or —R$_8$ includes a hydrogen atom, linear, branched, or cyclic alkyl groups having 1 to 20 carbon atoms; linear, branched, or cyclic alkoxy groups having 1 to 20 carbon atoms; linear, branched, or cyclic alkylthio groups having 1 to 20 carbon atoms; mono-, di-, or tri-alkylsilyl groups having 1 to 60 carbon atoms; mono-, or di-alkylamino group having 1 to 40 carbon atoms; aryl groups having 6 to 60 carbon atoms; aryloxy groups having 6 to 60 carbon atoms; arylalkyl groups having 7 to 60 carbon atoms; arylalkoxy groups having 7 to 60 carbon atoms; arylamino groups having 6 to 60 carbon atoms; heterocyclic compound groups having 3 to 60 carbon atoms and cyano group. The aryl group, aryloxy group, arylalkyl group, arylalkoxy group and arylamino group may have further substituents.

Carbon atoms in the group represented by above R are possibly replaced by oxygen atom or sulfur atom, one or more hydrogen atoms in R group may be replaced by fluorine atom.

In the above examples, a plurality of Rs are present in one structural formula, they may be the same or different, and they are selected independently each other. When Ar$_1$, Ar$_2$, Ar$_3$ or Ar$_5$ has a plurality of substituents, they may be the same or different. For enhancing the solubility into a solvent, it is preferable that at least one substituent other than a hydrogen atom is carried, and it is preferable that the symmetric property of the form of a repeating unit including a substituent is low.

X represents a group selected from —O—, —S—, —CR$_{11}$R$_{12}$—, —SiR$_{13}$R$_{14}$—, —NR$_{15}$—, —CO—, —COO—, —SO$_2$—, —CR$_{16}$=CR$_{17}$—, and —C≡C—. —O—, —S—, —CR$_{16}$=CR$_{17}$—, or —C≡C— is suitable, and —O— or —S— is more suitable, —O— is further more suitable. R$_{11}$ to R$_{17}$ represent, each independently, a hydrogen atom, linear, branched or cyclic alkyl group having 1-20 carbon atoms, aryl group having 6-60 carbon atoms, heterocyclic compound group having 3-60 carbon atoms, and a cyano group. The aryl group and the heterocyclic compound group may have further substituents.

Concrete examples of R$_3$ and R$_8$ include: linear, branched and cyclic alkyl groups of 1 to 20 carbon atoms such as methyl group, ethyl group, n-propyl group, iso-propyl group, n-butyl group, iso-butyl group, tert-butyl group, pentyl group, hexyl group, heptyl group, octyl group, nonyl group, decyl group, lauryl group, cyclopropyl group, cyclobutyl group, cyclopentyl group, cyclohexyl group, cycloheptyl group, cyclooctyl group, cyclononyl group, cyclododecyl group, and the like, and pentyl group, hexyl group, octyl group, decyl group and cyclohexyl group are preferable. As to the illustrated examples of alkyl groups, when prefixes, such as n- and iso-, are not specifically shown, the illustrated examples include all the alkyl groups of linear and branched structures. (Hereinafter referred to as the same).

Examples of mono-, di- and tri-alkylsilyl group of 1 to 60 carbon atoms include: mono-methylsilyl group, dimethylsilyl group, trimethylsilyl group, mono-ethylsilyl group, diethylsilyl group, triethylsilyl group, mono-propylsilyl group, dipropylsilyl group, tripropylsilyl group, mono-butylsilyl group, dibutylsilyl group, tributylsilyl group, mono-pentylsilyl group, dipentylsilyl group, tripentylsilyl group, mono-hexylsilyl group, dihexylsilyl group, trihexylsilyl group, mono-heptylsilyl group, diheptylsilyl group, triheptylsilyl group, mono-octylsilyl group, dioctylsilyl group, trioctylsilyl group, mono-nonylsilyl group, dinonylsilyl group, trinonylsilyl group, mono-decylsilyl group, didecylsilyl group, tridecylsilyl group, mono-laurylsilyl group, dilaurylsilyl group, trilaurylsilyl group, ethyldimethylsilyl group, propyldimethylsilyl group, butyldimethylsilyl group, pentyldimethylsilyl group, hexyldimethylsilyl group, heptyldimethylsilyl group, octyldimethylsilyl group, nonyldimethylsilyl group, decyldimethylsilyl group, lauryldimethylsilyl group and the like, and tripentylsilyl group, trihexylsilyl group, trioctylsilyl group, tridecylsilyl group, pentyldimethylsilyl group, hexyldimethylsilyl group, octyldimethylsilyl group decyldimethylsilyl group and dodecyldimethylsilyl group are preferable.

Examples of an arylalkyl group having 7-60 carbon atoms, include phenylmethyl group, phenylethyl group, phenylpropyl group, $C_1$-$C_{12}$ alkoxyphenylmethyl group, $C_1$-$C_{12}$ alkoxyphenylethyl group, $C_1$-$C_{12}$ alkoxyphenylpropyl group, $C_1$-$C_{12}$ alkylphenylmethyl group, $C_1$-$C_{12}$ alkylphenylethyl group, $C_1$-$C_{12}$ alkylphenylpropyl group, naphtylmethyl group, naphtylethyl group, naphtylpropyl group, and the like. Among them, $C_1$-$C_{12}$ alkoxyphenylmethyl group, $C_1$-$C_{12}$ alkoxyphenylethyl group, $C_1$-$C_{12}$ alkoxyphenylpropyl group, $C_1$-$C_{12}$ alkylphenylmethyl group, $C_1$-$C_{12}$ alkylphenylethyl group, $C_1$-$C_{12}$ alkylphenylpropyl group are suitable.

As an aryl group having 6-60 carbon atoms, concrete examples of R$_3$ and Ar$_4$ include phenyl group, $C_1$-$C_{12}$ alkoxyphenyl group ($C_1$-$C_{12}$ represents that the number of carbon atoms are 1-12. Hereinafter, referred to as the same.), $C_1$-$C_{12}$ alkylphenyl group, 1-naphtyl group, 2-naphtyl group, and the like. Among them, $C_1$-$C_{12}$ alkoxyphenyl group, and $C_1$-$C_{12}$ alkylphenyl group are suitable. Moreover, examples of a heterocyclic compound group having 4-60 carbon atoms include thienyl group, $C_1$-$C_{12}$ alkylthienyl group, pyroryl group, furyl group, pyridyl group, $C_1$-$C_{12}$ alkylpyridyl group, and the like. Among them, thienyl group, $C_1$-$C_{12}$ alkylthienyl group, pyridyl group, and $C_1$-$C_{12}$ alkylpyridyl group are suitable.

As a saturated heterocyclic compound group having 3-60 carbon atoms, concrete examples of $R_8$ include oxolanyl group, dioxolanyl group, thiolanyl group, oxathiolanyl group, pyrrolidinyl group, pyrrolidino group, pyrazolidyl group, imidazolidyl group, oxanyl group, thianyl group, piperidyl group, piperidino group, piperazinyl group, piperazino group, morpholinyl group, morpholino group, and the like. Oxolanyl group and oxanyl group are suitable.

Examples of mono- or di-alkylamino group having 1-40 carbon atoms include monomethylamino group, dimethylamino group, monoethylamino group, diethylamino group, monopropylamino group, dipropylamino group, monobutylamino group, dibutylamino group, monopentylamino group, dipentylamino group, monohexylamino group, dihexylamino group, monoheptylamino group, diheptylamino group, monooctylamino group, dioctylamino group, and the like. Pentylamino group, hexylamino group, octylamino group, decylamino group, dipentylamino group, dihexylamino group, dioctylamino group, and didecylamino group are suitable.

If the case where R are substituents other than hydrogen atom, cyano group, or a group represented by —X—$R_3$, —$Ar_4$, or —$R_8$, examples of a linear, branched or cyclic alkyl group of having 1-20 carbon atoms include methyl group, ethyl group, n-propyl group, iso-propyl group, n-butyl group, iso-butyl group, tert-butyl group, pentyl group, hexyl group, heptyl group, octyl group, nonyl group, decyl group, lauryl group, cyclopropyl group, cyclobutyl group, cyclopentyl group, cyclohexyl group, cycloheptyl group, cyclooctyl group, cyclononyl group, cyclododecyl group, and the like. Pentyl group, hexyl group, octyl group, decyl group, and cyclohexyl group are suitable.

Examples of an alkoxy group having a linear, branched or cyclic alkyl group having 1-20 carbon atoms, include methoxy group, ethoxy group, n-propyloxy group, iso-propyloxy group, n-butoxy group, iso-butoxy group, tert-butoxy group, pentyloxy group, hexyloxy group, heptyloxy group, octyloxy group, nonyloxy group, decyloxy group, lauryloxy group, cyclopropyloxy group, cyclobutyloxy group, cyclopentyloxy group, cyclohexyloxy group, cycloheptyloxy group, and the like. Pentyloxy group, hexyloxy group, octyloxy group, decyloxy group, and cyclohexyloxy group are suitable.

Examples of an alkylthio group having a linear, branched or cyclic alkyl group having 1-20 carbon atoms, include methylthio group, ethylthio group, n-propylthio group, iso-propylthio group, n-butylthio group, iso-butylthio group, tert-butylthio group, pentylthio group, hexylthio group, heptylthio group, octylthio group, nonylthio group, decylthio group, laurylthio group, cyclopropylthio group, cyclobutylthio group, cyclopentylthio group, cyclohexylthio group, cycloheptylthio group, and the like. Pentylthio group, hexylthio group, octylthio group, decylthio group, and cyclohexylthio group are suitable.

Examples of linear, branched or cyclic alkylsilyl group having 1-60 carbon atoms include monomethylsilyl group, dimethylsilyl group, trimethylsilyl group, monoethylsilyl group, diethylsilyl group, triethylsilyl group, monopropylsilyl group, dipropylsilyl group, tripropylsilyl group, monobutylsilyl group, dibutylsilyl group, tributylsilyl group, monopentylsilyl group, dipentylsilyl group, tripentylsilyl group, monohexylsilyl group, dihexylsilyl group, trihexylsilyl group, monoheptylsilyl group, diheptylsilyl group, triheptylsilyl group, monooctylsilyl group, dioctylsilyl group, trioctylsilyl group, mononylsilyl group, dinonylsilyl group, trinonylsilyl group, monodecylsilyl group, didecylsilyl group, tridecylsilyl group, monolaurylsilyl group, dilaurylsilyl group, trilaurylsilyl group, ethyldimethylsilyl group, propyldimethylsilyl group, butyldimethylsilyl group, pentyldimethylsilyl group, hexyldimethylsilyl group, heptyldimethylsilyl group, octyldimethylsilyl group, nonyldimethylsilyl group, decyldimethylsilyl group, lauryldimethylsilyl group, and the like.

Among them, tripentylsilyl group, trihexylsilyl group, trioctylsilyl group, tridecylsilyl group, pentyldimethylsilyl group, hexyldimethylsilyl group, octyldimethylsilyl group, and decyldimethylsilyl group are suitable.

Examples of the mono- or di-alkylamino group having 1-40 carbon atoms include monomethylamino group, dimethylamino group, mono ethylamino group, diethylamino group, monopropylamino group, dipropylamino group, monobutylamino group, dibutylamino group, monopentylamino group, dipentylamino group, monohexylamino group, dihexylamino group, monoheptylamino group, diheptylamino group, monooctylamino group, dioctylamino group, monononylamino group, dinonylamino group, monodecylamino group, didecylamino group, monolaurylamino group, dilaurylamino group, and the like. Among them, pentylamino group, hexylamino group, octylaminogroup, decylaminogroup, dipentylamino group, dihexylaminogroup, dioctylaminogroup, and didecylamino group are suitable.

Examples of an aryl group having 6-60 carbon atoms include phenyl group, $C_1$-$C_{12}$ alkoxyphenyl group ($C_1$-$C_{12}$ represents that the number of carbon atoms are 1-12. Hereinafter, referred to as the same.), $C_1$-$C_{12}$ alkylphenyl group, 1-naphtyl group, 2-naphtyl group, and the like. Among them, $C_1$-$C_{12}$ alkoxyphenyl group, and $C_1$-$C_{12}$ alkylphenyl group are suitable.

Examples of an aryloxy group having 6-60 carbon atoms include phenoxy group, $C_1$-$C_{12}$ alkoxyphenoxy group, $C_1$-$C_{12}$ alkylphenoxy group, 1-naphtyloxy group, 2-naphtyloxy group, and the like. Among them, $C_1$-$C_{12}$ alkoxyphenoxy group, and $C_1$-$C_{12}$ alkylphenoxy group are suitable.

Examples of an arylalkyl group having 7-60 carbon atoms include phenyl-$C_1$-$C_{12}$ alkyl group, $C_1$-$C_{12}$ alkoxyphenyl-$C_1$-$C_{12}$ alkyl group, $C_1$-$C_{12}$ alkylphenyl-$C_1$-$C_{12}$ alkyl group, 1-naphtyl-$C_1$-$C_{12}$ alkyl group, 2-naphtyl-$C_1$-$C_{12}$ alkyl group, and the like. Among them, $C_1$-$C_{12}$ alkoxyphenyl-$C_1$-$C_{12}$ alkyl group, and $C_1$-$C_{12}$ alkylphenyl-$C_1$-$C_{12}$ alkyl group are suitable.

Examples of an arylalkoxy group having 7-60 carbon atoms include phenyl-$C_1$-$C_{12}$ alkoxy group, $C_1$-$C_{12}$ alkoxyphenyl-$C_1$-$C_{12}$ alkoxygroup, $C_1$-$C_{12}$ alkylphenyl-$C_1$-$C_{12}$ alkoxy group, 1-naphtyl-$C_1$-$C_{12}$ alkoxy group, 2-naphtyl-$C_1$-$C_{12}$ alkoxy group, and the like.

Among them, $C_1$-$C_{12}$ alkoxyphenyl-$C_1$-$C_{12}$ alkoxy group, and $C_1$-$C_{12}$ alkylphenyl-$C_1$-$C_{12}$ alkoxy group are suitable.

As an arylalkenyl group having 8-60 carbon atoms, phenylethenyl group, naphtylethenyl group, anthrylethenyl group, pyrenylethenyl group, etc. are exemplified. These may have further $C_1$-$C_{12}$ alkyl group, $C_1$-$C_{12}$ alkoxy group, and $C_6$-$C_{20}$ aryl group as a substituent. Among them, phenylethenyl group, phenylethenyl group having $C_1$-$C_{12}$ alkoxy group, the phenylethenyl group having $C_1$-$C_{12}$ alkyl group are suitable.

As an arylalkynyl group having 8-60 carbon atoms, phenylethynyl group, naphtylethynyl group, anthrylethynyl group, pyrenylethynyl group, etc. are exemplified. These may have further $C_1$-$C_{12}$ alkyl group, $C_1$-$C_{12}$ alkoxy group, and $C_6$-$C_{20}$ aryl group as a substituent. Phenyl ethynyl group, phenylethynyl group having $C_1$-$C_{12}$ alkoxy group, and phenylethynyl group having $C_1$-$C_{12}$ alkyl group are suitable.

Examples of a mono or diarylamino group having 6-60 carbon atoms include phenylamino group, diphenylamino group, $C_1$-$C_{12}$ alkoxyphenylamino group, a di-($C_1$-$C_{12}$ alkoxyphenyl)amino group, a di-($C_1$-$C_{12}$ alkylphenyl)amino group, 1-naphtylamino group, 2-naphtylamino group, and the like. Among them, $C_1$-$C_{12}$ alkylphenylamino group, and a ƒW ($C_1$-$C_{12}$ alkylphenyl)amino group are suitable.

As a heterocyclic compound group having 3-60 carbon atoms, pyrrolyl group, oxazolyl group, isoxazolyl group, thiazolyl group, isothiazolyl group, pyranyl group, pyridyl group, pyridazinyl group, pyrimidyl group, pyrazyl group, quinolyl group, oxazyl group, dioxazyl group, indolyl group, isoindolyl group, indazolyl group, chromenyl group, quinolyl group, isoquinolyl group, cinnolyl group, quinazolyl group, quinoxalyl group, phthalazyl group, purinyl group, pteridyl group, xanthenyl group, carbazolyl group, phenanthridyl group, acridyl group, phnazyl group, phennthrolyl group, thianaphtalenyl group, dithianaphtalenyl group, furyl group, benzofuryl group, dibenzofuryl group, thienyl group, benzothienyl group, dibenzothienyl group, oxadiazolyl group, oxazolyl group, triazolylgroup, thiodiazolyl group, benzoxazolyl group, benzodiazolyl group, silolyl group, benzosilolylgroup, etc. are exemplified. These may have further $C_1$-$C_{12}$alkyl group, $C_1$-$C_{12}$alkoxy group, and $C_6$-$C_{20}$ aryl group as a substituent. A heterocyclic compound group having 4-60 carbon atoms is preferable, and more preferably, a heterocyclic compound group having 4-30 carbon atoms. Thienyl group, thienyl group having $C_1$-$C_{12}$ alkyl group, pyridyl group, and pyridyl group having $C_1$-$C_{12}$ alkyl group is suitable.

Among the examples of R, the substituent containing an alkyl chain can be either of linear, branched, or cyclic one, or the combination thereof. When it is not linear, exemplified are isoamyl group, 2-ethylhexyl group, 3,7-dimethyloctyl group, cyclohexyl group, 4-$C_1$-$C_{12}$ alkylcyclohexyl group, and the like. In order to improve the solubility to solvent of a polymeric fluorescent substance, it is suitable that a cyclic or branched alkyl chain is contained in one of the substituents of $Ar_1$, $Ar_2$, $Ar_4$, and $Ar_5$. Moreover, the terminal ends of two alkyl chains can be connected to form a ring. Furthermore, carbon atoms of a part of alkyl chain may be replaced by a group containing a hetero atom. Examples of hetero atoms include an oxygen atom, a sulfur atom, a nitrogen atom, and the like.

Furthermore, among the examples of R, when an aryl group or a heterocyclic compound group is contained in the part, they can contain one or more substituents.

In the above formula (1), the symbol m is 0 or 1. In the above formula (2), the symbol p is 0 or 1. In the above formula (3), the symbol r is 0 or 1. $R_1$, $R_2$ in the above formula (1), $R_4$, $R_5$ in the above formula (2), $R_6$, $R_7$ in the above formula (3), and $R_9$ and $R_{10}$ in the above formula (3) represent each independently, a group selected from a hydrogen atom, a linear, branched and cyclic alkyl group having 1-20 carbon atoms, an aryl group having 6-60 carbon atoms, a heterocyclic compound group having 4-60 carbon atoms and cyano group. The aryl group and the heterocyclic compound group may have substituents.

When $R_1$, $R_2$, $R_4$-$R_7$, $R_9$ and $R_{10}$ are substituents other than a hydrogen atom or a cyano group, examples of a linear, branched or cyclic alkyl group having 1-20 carbon atoms include methyl group, ethyl group, n-propyl group, iso-propyl group, n-butyl group, iso-butyl group, tert-butyl group, pentyl group, hexyl group, heptyl group, octyl group, nonyl group, decyl group, lauryl group, cyclopropyl group, cyclobutyl group, cyclopentyl group, cyclohexyl group, cycloheptyl group, cyclooctyl group, cyclononyl group, cyclododecyl group, and the like. Among them, pentyl group, hexyl group, octyl group, decyl group, and cyclohexyl group are suitable.

Examples of an aryl group having 6-60 carbon atoms include phenyl group, $C_1$-$C_{12}$ alkoxyphenyl group, $C_1$-$C_{12}$ alkylphenyl group, 1-naphtyl group, 2-naphtyl group, and the like. Among them, phenyl group, and $C_1$-$C_{12}$ alkylphenyl group are suitable.

As a heterocyclic compound group having 3-60 carbon atoms, pyrrolyl group, oxazolyl group, isoxazolyl group, thiazolyl group, isothiazolyl group, pyranyl group, pyridyl group, pyridazinyl group, pyrimidyl group, pyrazyl group, quinolyl group, oxazyl group, dioxazyl group, indolyl group, isoindolyl group, indazolyl group, chromenyl group, quinolyl group, isoquinolyl group, cinnolyl group, quinazolyl group, quiozalyl group, phthalazyl group, purinyl group, pteridyl group, xanthenyl group, carbazolyl group, phenanthridyl group, acridyl group, phnazyl group, phennthrolyl group, thianaphtalenyl group, dithianaphtalenyl group, furyl group, benzofuryl group, dibenzofuryl group, thienyl group, benzothienyl group, dibenzothienyl group, oxadiazolyl group, oxazolyl group, triazolylgroup, thiodiazolyl group, benzoxazolyl group, benzodiazolyl group, silolyl group, benzosilolylgroup, etc. are exemplified. These may have further $C_1$-$C_{12}$ alkyl group, $C_1$-$C_{12}$ alkoxy group, and $C_6$-$C_{20}$ aryl group as a substituent. A heterocyclic compound group having 4-60 carbon atoms is preferable, and more preferably, a heterocyclic compound group having 4-30 carbon atoms. Thienyl group, thienyl group having $C_1$-$C_{12}$ alkyl group, pyridyl group, and pyridyl group having $C_1$-$C_{12}$ alkyl group is suitable.

Moreover, as for the end group of a polymeric fluorescent substance, if the polymerizable group remains as it is, the light-emitting property and lifetime of a device using thereof may fall, and it can be protected by a stable group.

Preferable is a conjugated bond successively connected to the conjugated structure of a main chain. For example, structures bonding to an aryl group or a heterocyclic compound group through vinylene group are included. Specifically, a substituent such as the chemical formula 10 described in JP-A 9-45478 is exemplified.

For synthesizing this polymeric fluorescent substance, when the main chain has vinylene groups, there are exemplified methods described in JP-A No. 5-202355. Namely, there are exemplified polymerization of dialdehyde compounds with diphosphonium salt compounds, polymerization of dialdehyde compounds with bisphosphate ester compounds by Wittig reaction such as Horner-Wadsworth-Emmons method, condensation polymerization by dehydrogenation method of a compound having two methyl halide groups, condensation polymerization by sulfonium salt decomposition method of a compound having two sulfonium base group, polymerization of dialdehyde compounds with diacetonitrile compounds or of compounds having both of aldehyde and acetonitrile groups by the Knoevenagel reaction, and the like. Among them, polymerization by Wittig reaction, condensation polymerization by dehydrohalogenation method and condensation polymerization by sulfonium salt decomposition method are easy to conduct, as described in JP-A-3-244630.

Further, when the main chain does not have a vinylene group, there are exemplified a method in which polymerization is conducted from the corresponding monomer by the Suzuki coupling reaction, a method in which polymerization is conducted by the Grignard reaction, a method in which polymerization is conducted using a Ni(0) catalyst, a method in which polymerization is conducted using an oxidizing agents such as $FeCl_3$ and the like, a method in which oxidation polymerization is conducted electrochemically, a method in which an intermediate polymer having a suitable releasing group is decomposed, and the like.

This polymeric fluorescent substance may contain other repeating unit than the repeating unit of the formulae (1), (2), (3) or (4) in the range wherein luminescent property and charge transport property do not deteriorate. The repeating unit of the formulae (1), (2), (3), (4) or other unit than the repeating unit of the formulae (1), (2), (3) or (4) may be connected via a non-conjugated unit, or such non-conjugated part may also contained in the repeating unit. As the linkage structure, there are exemplified those shown in the following chemical formula 21, combinations of those shown in the following chemical formula 21 with a vinylene group, combinations of two or more of those shown in the following chemical formula 21, and the like. Herein, R's each independently represents a group selected from the group exemplified above, and Ar represents a hydrocarbon group of 6 to 60 carbon atoms. Specific examples of these groups are the same as those exemplified above.

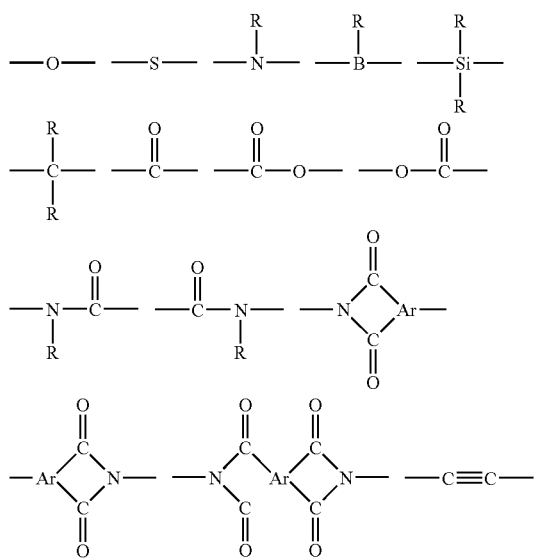

This polymeric fluorescent substance may also be a random, block or graft copolymer, or a polymer having an intermediate structure thereof, for example, a random copolymer having blocking property. From the viewpoint for obtaining a polymeric fluorescent substance having high fluorescent quantum yield, random copolymers having blocking property and block or graft copolymers are more preferable than complete random copolymers. Dendrimers or copolymers having branching in the main chain and having three or more terminals are also included.

Further, as the polymeric fluorescent substance, those emitting fluorescence in a solid state are suitably used, since the material utilizes light emission from a thin film.

As good solvents for the polymeric fluorescent substance, there are exemplified chloroform, methylene chloride, dichloroethane, tetrahydrofuran, toluene, xylene, mesitylene, tetralin, decalin, n-butylbenzene and the like. The polymeric fluorescent substance can be usually dissolved in these solvents in an amount of 0.1 wt % or more, though the amount differs depending on the structure and molecular weight of the polymeric fluorescent substance.

The polymeric fluorescent substance has a number-average molecular weight of $1 \times 10^4$ to $1 \times 10^8$ in terms of polystyrene, and the degree of polymerization thereof also changes depending on repeating structures and proportion thereof. From the standpoint of film forming property, generally the total amount of repeating structures is preferably from 20 to 10000, more preferably from 30 to 10000, particularly preferably from 50 to 5000.

When these polymeric fluorescent substances are used as a light-emitting material of a polymer LED, the purity thereof exerts an influence on light-emitting property, therefore, it is preferable that a monomer before polymerization is purified by a method such as distillation, sublimation purification, re-crystallization and the like before being polymerized and further, it is preferable to conduct a purification treatment such as re-precipitation purification, chromatographic separation and the like after the synthesis.

Moreover, the ratio of hole drift mobility $\mu_H$ to electron drift mobility $\mu_E$ ($\mu_H/\mu_E$) of a polymeric fluorescent substance used for polymer light-emitting diode of the present invention measured by the Standard Time-of-Flight method is in the ranges of 0.1-10, and suitably 0.2-5.

Especially, the hole drift mobility $\mu_0$ without energetic disorder and spatial disorder in polymeric fluorescent substance, is suitably less than $5 \times 10^{-4}$ cm$^2$/v/s, and more suitably less than $2 \times 10^{-4}$ cm$^2$/v/s.

"The hole drift mobility $\mu_0$ without energetic disorder and spatial disorder" is defined by the following formula (1) according to Phys. Stat. Sol. (b) Vol. 107 (1981) p. 9.

The value of $\mu_0$ is obtained by the Standard Time-of-Flight method, with measuring hole drift mobility $\mu(E, T)$ of a polymeric fluorescent substance with changing electric field (E) and/or temperature (T) and applying to the following formula (1).

$$\mu(E, T) = \mu_0 \exp\left[-\left(\frac{2\sigma}{3kT}\right)^2\right] \exp\left\{E^{1/2} C\left[\left(\frac{\sigma}{kT}\right)^2 - \Sigma^2\right]\right\} \quad (1)$$

E is electric field, T is absolute temperature, $\mu(E, T)$ is hole drift mobility at electric field E and temperature T, k is Boltzmann's constant, C is a constant. $\sigma$ is the degree of energetic disorder representing the Gaussian width of energetic distribution of a hopping site, $\Sigma$ is the degree of spatial disorder representing the Gaussian width of spatial distribution of a hopping site.

Specifically, applying to the formula (1) is carried out as follows. Namely, $E^{1/2}$ and log[$\mu(E, T)$] are plotted at each temperature T, by using the measured hole drift mobility $\mu(E, T)$ and electric field E. Straight line approximation by a least-square method is carried out, and the intercept value $\mu(E \rightarrow 0, T)$ of the straight line is obtained.

Subsequently, $1/T^2$ and log[$\mu(E \rightarrow 0, T)$] are plotted, straight line approximation by a least-square method is carried out, and the value $\mu_0$ is obtained from the intercept of the straight line.

In the above, the temperature of hole drift mobility $\mu(E, T)$ measurement are usually changed in a range of from liquid nitrogen temperature to 80° C., and the electric field is usually changed in the range of $10^4$-$10^7$ v/cm.

The Standard Time-of-Flight method used for measurement of the above drift mobility is described in F. K. Dolezalek, Photoconductivity and Related Phenomena, Eds. J. Mort & D. M. Pai (New York) Chap. 2 (1976) p. 27).

Next, the polymer LED of the present invention will be illustrated. The polymer LED of the present invention is a polymer LED comprising a pair of electrodes composed of an anode and a cathode at least one of which is transparent or semitransparent and a light-emitting layer disposed between the electrodes, and a polymeric fluorescent substance of the present invention is contained in the light-emitting layer.

As the polymer LED of the present invention, there are listed polymer LEDs having an electron-transporting layer disposed between a cathode and a light-emitting layer, polymer LEDs having a hole-transporting layer disposed between an anode and a light-emitting layer, polymer LEDs having an electron-transporting layer disposed between a cathode and a light-emitting layer and having a hole-transporting layer disposed between an anode and a light-emitting layer.

For example, the following structures a) to d) are specifically exemplified.

a) anode/light-emitting layer/cathode
b) anode/hole-transporting layer/light-emitting layer/cathode
c) anode/light-emitting layer/electron-transporting layer/cathode
d) anode/hole-transporting layer/light-emitting layer/electron-transporting layer/cathode (wherein,/indicates adjacent lamination of layers. Hereinafter, referred to as the same)

Herein, the light-emitting layer is a layer having function to emit a light, the hole-transporting layer is a layer having function to transport a hole, and the electron-transporting layer is a layer having function to transport an electron. Herein, the electron-transporting layer and the hole-transporting layer are generically called a charge-transporting layer.

The light-emitting layer, hole-transporting layer and electron-transporting layer may also each independently used in two or more layers.

Of charge-transporting layers disposed adjacent to an electrode, that having function to improve charge-injecting efficiency from the electrode and having effect to decrease driving voltage of an device are particularly called sometimes a charge-injecting layer (hole-injecting layer, electron-injecting layer) in general.

For enhancing adherence with an electrode and improving charge injection from an electrode, the above-described charge-injecting layer or insulation layer having a thickness of 2 nm or less may also be provided adjacent to an electrode, and further, for enhancing adherence of the interface, preventing mixing and the like, a thin buffer layer may also be inserted into the interface of a charge-transporting layer and light-emitting layer.

The order and number of layers laminated and the thickness of each layer can be appropriately applied while considering light-emitting efficiency and life of the device.

In the present invention, as the polymer LED having a charge-injecting layer (electron-injecting layer, hole-injecting layer) provided, there are listed a polymer LED having a charge-injecting layer provided adjacent to a cathode and a polymer LED having a charge-injecting layer provided adjacent to an anode.

For example, the following structures e) to p) are specifically exemplified.

e) anode/charge-injecting layer/light-emitting layer/cathode
f) anode/light-emitting layer/charge injecting layer/cathode
g) anode/charge-injecting layer/light-emitting layer/charge-injecting layer/cathode
h) anode/charge-injecting layer/hole-transporting layer/light-emitting layer/cathode
i) anode/hole-transporting layer/light-emitting layer/charge-injecting layer/cathode
j) anode/charge-injecting layer/hole-transporting layer/light-emitting layer/charge-injecting layer/cathode
k) anode/charge-injecting layer/light-emitting layer/electron-transporting layer/cathode
l) anode/light-emitting layer/electron-transporting layer/charge-injecting layer/cathode
m) anode/charge-injecting layer/light-emitting layer/electron-transporting layer/charge-injecting layer/cathode
n) anode/charge-injecting layer/hole-transporting layer/light-emitting layer/electron-transporting layer/cathode
o) anode/hole-transporting layer/light-emitting layer/electron-transporting layer/charge-injecting layer/cathode
p) anode/charge-injecting layer/hole-transporting layer/light-emitting layer/electron-transporting layer/charge-injecting layer/cathode As the specific examples of the charge-injecting layer, there are exemplified layers containing an conducting polymer, layers which are disposed between an anode and a hole-transporting layer and contain a material having an ionization potential between the ionization potential of an anode material and the ionization potential of a hole-transporting material contained in the hole-transporting layer, layers which are disposed between a cathode and an electron-transporting layer and contain a material having an electron affinity between the electron affinity of a cathode material and the electron affinity of an electron-transporting material contained in the electron-transporting layer, and the like.

When the above-described charge-injecting layer is a layer containing an conducting polymer, the electric conductivity of the conducting polymer is preferably $10^{-5}$ S/cm or more and $10^3$ S/cm or less, and for decreasing the leak current between light-emitting pixels, more preferably $10^{-5}$ S/cm or more and $10^2$ S/cm or less, further preferably $10^{-5}$ S/cm or more and $10^1$ S/cm or less.

Usually, to provide an electric conductivity of the conducting polymer of $10^{-5}$ S/cm or more and $10^3$ S/cm or less, a suitable amount of ions are doped into the conducting polymer.

Regarding the kind of an ion doped, an anion is used in a hole-injecting layer and a cation is used in an electron-injecting layer. As examples of the anion, a polystyrene sulfonate ion, alkylbenzene sulfonate ion, camphor sulfonate ion and the like are exemplified, and as examples of the cation, a lithium ion, sodium ion, potassium ion, tetrabutyl ammonium ion and the like are exemplified.

The thickness of the charge-injecting layer is for example, from 1 nm to 100 nm, preferably from 2 nm to 50 nm.

Materials used in the charge-injecting layer may properly be selected in view of relation with the materials of electrode and adjacent layers, and there are exemplified conducting polymers such as polyaniline and derivatives thereof, polythiophene and derivatives thereof, polypyrrole and derivatives thereof, poly(phenylene vinylene) and derivatives thereof, poly(thienylene vinylene) and derivatives thereof, polyquinoline and derivatives thereof, polyquinoxaline and derivatives thereof, polymers containing aromatic amine structures in the main chain or the side chain, and the like, and metal phthalocyanine (copper phthalocyanine and the like), carbon and the like.

The insulation layer having a thickness of 2 nm or less has function to make charge injection easy. As the material of the above-described insulation layer, metal fluoride, metal oxide, organic insulation materials and the like are listed. As the polymer LED having an insulation layer having a thickness of 2 nm or less, there are listed polymer LEDs having an insulation layer having a thickness of 2 nm or less provided adjacent to a cathode, and polymer LEDs having an insulation layer having a thickness of 2 nm or less provided adjacent to an anode.

Specifically, there are listed the following structures q) to ab) for example.

q) anode/insulation layer having a thickness of 2 nm or less/light-emitting layer/cathode r) anode/light-emitting layer/insulation layer having a thickness of 2 nm or less/cathode s) anode/insulation layer having a thickness of 2 nm or less/light-emitting layer/insulation layer having a thickness of 2 nm or less/cathode t) anode/insulation layer having a thickness of 2 nm or less/hole-transporting layer/light-emitting layer/cathode u) anode/hole-transporting layer/light-emitting layer/insulation layer having a thickness of 2 nm or less/cathode v) anode/insulation layer having a thickness of 2 nm or less/hole-transporting layer/light-emitting layer/insulation layer having a thickness of 2 nm or less/cathode w) anode/insulation layer having a thickness of 2 nm or less/light-emitting layer/electron-transporting layer/cathode x) anode/light-emitting layer/electron-transporting layer/insulation layer having a thickness of 2 nm or less/cathode y) anode/insulation layer having a thickness of 2 nm or less/light-emitting layer/electron-transporting layer/insulation layer having a thickness of 2 nm or less/cathode z) anode/insulation layer having a thickness of 2 nm or less/hole-transporting layer/light-emitting layer/electron-transporting layer/cathode aa) anode/hole-transporting layer/light-emitting layer/electron-transporting layer/insulation layer having a thickness of 2 nm or less/cathode ab) anode/insulation layer having a thickness of 2 nm or less/hole-transporting layer/light-emitting layer/electron-transporting layer/insulation layer having a thickness of 2 nm or less/cathode In producing a polymer LED, when a film is formed from a solution by using such polymeric fluorescent substance soluble in an organic solvent, only required is removal of the solvent by drying after coating of this solution, and even in the case of mixing of a charge-transporting material and a light-emitting material, the same method can be applied, causing an extreme advantage in production. As the film forming method from a solution, there can be used coating methods such as a spin coating method, casting method, micro gravure coating method, gravure coating method, bar coating method, roll coating method, wire bar coating method, dip coating method, spray coating method, screen printing method, flexo printing method, offset printing method, inkjet printing method and the like.

Regarding the thickness of the light-emitting layer, the optimum value differs depending on material used, and may properly be selected so that the driving voltage and the light-emitting efficiency become optimum values, and for example, it is from 1 nm to 1 µm, preferably from 2 nm to 500 nm, further preferably from 5 nm to 200 nm.

In the polymer LED of the present invention, light-emitting materials other than the above-described polymeric fluorescent substance can also be mixed in a light-emitting layer. Further, in the polymer LED of the present invention, the light-emitting layer containing light-emitting materials other than the above-described polymeric fluorescent substance may also be laminated with a light-emitting layer containing the above-described polymeric fluorescent substance.

As the light-emitting material, known materials can be used. In a compound having lower molecular weight, there can be used, for example, naphthalene derivatives, anthracene or derivatives thereof, perylene or derivatives thereof; dyes such as polymethine dyes, xanthene dyes, coumarine dyes, cyanine dyes; metal complexes of 8-hydroxyquinoline or derivatives thereof, aromatic amine, tetraphenylcyclopentane or derivatives thereof, or tetraphenylbutadiene or derivatives thereof, and the like.

Specifically, there can be used known compounds such as those described in JP-A Nos. 57-51781, 59-195393 and the like, for example.

When the polymer LED of the present invention has a hole-transporting layer, as the hole-transporting materials used, there are exemplified polyvinylcarbazole or derivatives thereof, polysilane or derivatives thereof, polysiloxane derivatives having an aromatic amine in the side chain or the main chain, pyrazoline derivatives, arylamine derivatives, stilbene derivatives, triphenyldiamine derivatives, polyaniline or derivatives thereof, polythiophene or derivatives thereof, polypyrrole or derivatives thereof, poly(p-phenylenevinylene) or derivatives thereof, poly(2,5-thienylenevinylene) or derivatives thereof, or the like.

Specific examples of the hole-transporting material include those described in JP-A Nos. 63-70257, 63-175860, 2-135359, 2-135361, 2-209988, 3-37992 and 3-152184.

Among them, as the hole-transporting materials used in the hole-transporting layer, preferable are polymer hole-transporting materials such as polyvinylcarbazole or derivatives thereof, polysilane or derivatives thereof, polysiloxane derivatives having an aromatic amine compound group in the side chain or the main chain, polyaniline or derivatives thereof, polythiophene or derivatives thereof, poly(p-phenylenevinylene) or derivatives thereof, poly(2,5-thienylenevinylene) or derivatives thereof, or the like, and further preferable are polyvinylcarbazole or derivatives thereof, polysilane or derivatives thereof and polysiloxane derivatives having an aromatic amine compound group in the side chain or the main chain. In the case of a hole-transporting material having lower molecular weight, it is preferably dispersed in a polymer binder for use.

Polyvinylcarbazole or derivatives thereof are obtained, for example, by cation polymerization or radical polymerization from a vinyl monomer.

As the polysilane or derivatives thereof, there are exemplified compounds described in Chem. Rev., 89, 1359 (1989) and GB 2300196 published specification, and the like. For synthesis, methods described in them can be used, and a Kipping method can be suitably used particularly.

As the polysiloxane or derivatives thereof, those having the structure of the above-described hole-transporting material having lower molecular weight in the side chain or main chain, since the siloxane skeleton structure has poor hole-transporting property. Particularly, there are exemplified those having an aromatic amine having hole-transporting property in the side chain or main chain.

The method for forming a hole-transporting layer is not restricted, and in the case of a hole-transporting layer having lower molecular weight, a method in which the layer is formed from a mixed solution with a polymer binder is exemplified. In the case of a polymer hole-transporting material, a method in which the layer is formed from a solution is exemplified.

The solvent used for the film forming from a solution is not particularly restricted providing it can dissolve a hole-transporting material. As the solvent, there are exemplified chlorine solvents such as chloroform, methylene chloride, dichloroethane and the like, ether solvents such as tetrahydrofuran and the like, aromatic hydrocarbon solvents such as toluene, xylene and the like, ketone solvents such as acetone, methyl ethyl ketone and the like, and ester solvents such as ethyl acetate, butyl acetate, ethylcellosolve acetate and the like.

As the film forming method from a solution, there can be used coating methods such as a spin coating method, casting method, micro gravure coating method, gravure coating method, bar coating method, roll coating method, wire bar coating method, dip coating method, spray coating method, screen printing method, flexo printing method, offset printing method, inkjet printing method and the like, from a solution.

The polymer binder mixed is preferably that does not disturb charge transport extremely, and that does not have strong absorption of a visible light is suitably used. As such polymer binder, polycarbonate, polyacrylate, poly(methyl acrylate), poly(methyl methacrylate), polystyrene, poly(vinyl chloride), polysiloxane and the like are exemplified.

Regarding the thickness of the hole-transporting layer, the optimum value differs depending on material used, and may properly be selected so that the driving voltage and the light-emitting efficiency become optimum values, and at least a thickness at which no pin hole is produced is necessary, and too large thickness is not preferable since the driving voltage of the device increases. Therefore, the thickness of the hole-transporting layer is, for example, from 1 nm to 1 µm, preferably from 2 nm to 500 nm, further preferably from 5 nm to 200 nm.

When the polymer LED of the present invention has an electron-transporting layer, known compounds are used as the electron-transporting materials, and there are exemplified oxadiazole derivatives, anthraquinonedimethane or derivatives thereof, benzoquinone or derivatives thereof, naphthoquinone or derivatives thereof, anthraquinone or derivatives thereof, tetracyanoanthraquinodimethane or derivatives thereof, fluorenone derivatives, diphenyldicyanoethylene or derivatives thereof, diphenoquinone derivatives, or metal complexes of 8-hydroxyquinoline or derivatives thereof, polyquinoline and derivatives thereof, polyquinoxaline and derivatives thereof, polyfluorene or derivatives thereof, and the like.

Specifically, there are exemplified those described in JP-A Nos. 63-70257, 63-175860, 2-135359, 2-135361, 2-209988, 3-37992 and 3-152184.

Among them, oxadiazole derivatives, benzoquinone or derivatives thereof, anthraquinone or derivatives thereof, or metal complexes of 8-hydroxyquinoline or derivatives thereof, polyquinoline and derivatives thereof, polyquinoxaline and derivatives thereof, polyfluorene or derivatives thereof are preferable, and 2-(4-biphenyl)-5-(4-t-butylphenyl)-1,3,4-oxadiazole, benzoquinone, anthraquinone, tris(8-quinolinol)aluminum and polyquinoline are further preferable.

The method for forming the electron-transporting layer is not particularly restricted, and in the case of an electron-transporting material having lower molecular weight, a vapor deposition method from a powder, or a method of film-forming from a solution or melted state is exemplified, and in the case of a polymer electron-transporting material, a method of film-forming from a solution or melted state is exemplified, respectively.

The solvent used in the film-forming from a solution is not particularly restricted provided it can dissolve electron-transporting materials and/or polymer binders. As the solvent, there are exemplified chlorine solvents such as chloroform, methylene chloride, dichloroethane and the like, ether solvents such as tetrahydrofuran and the like, aromatic hydrocarbon solvents such as toluene, xylene and the like, ketone solvents such as acetone, methyl ethyl ketone and the like, and ester solvents such as ethyl acetate, butyl acetate, ethylcellosolve acetate and the like.

As the film-forming method from a solution or melted state, there can be used coating methods such as a spin coating method, casting method, micro gravure coating method, gravure coating method, bar coating method, roll coating method, wire bar coating method, dip coating method, spray coating method, screen printing method, flexo printing method, offset printing method, inkjet printing method and the like.

The polymer binder to be mixed is preferably that which does not extremely disturb a charge transport property, and that does not have strong absorption of a visible light is suitably used. As such polymer binder, poly(N-vinylcarbazole), polyaniline or derivatives thereof, polythiophene or derivatives thereof, poly(p-phenylene vinylene) or derivatives thereof, poly(2,5-thienylene vinylene) or derivatives thereof, polycarbonate, polyacrylate, poly(methyl acrylate), poly(methyl methacrylate), polystyrene, poly(vinyl chloride), polysiloxane and the like are exemplified.

Regarding the thickness of the electron-transporting layer, the optimum value differs depending on material used, and may properly be selected so that the driving voltage and the light-emitting efficiency become optimum values, and at least a thickness at which no pin hole is produced is necessary, and too large thickness is not preferable since the driving voltage of the device increases. Therefore, the thickness of the electron-transporting layer is, for example, from 1 nm to 1 µm, preferably from 2 nm to 500 nm, further preferably from 5 nm to 200 nm.

The substrate forming the polymer LED of the present invention may preferably be that does not change in forming an electrode and layers of organic materials, and there are exemplified glass, plastics, polymer film, silicon substrates and the like. In the case of a opaque substrate, it is preferable that the opposite electrode is transparent or semitransparent.

In the present invention, it is preferable that an anode is transparent or semitransparent, and as the material of this anode, electron conductive metal oxide films, semitransparent metal thin films and the like are used. Specifically, there are used indium oxide, zinc oxide, tin oxide, and films (NESA and the like) fabricated by using an electron conductive glass composed of indium•tin•oxide (ITO), indium•zinc•oxide and the like, which are metal oxide complexes, and gold, platinum, silver, copper and the like are used, and among them, ITO, indium•zinc•oxide, tin oxide are preferable. As the fabricating method, a vacuum vapor deposition method, sputtering method, ion plating method, plating method and the like are used. As the anode, there may also be used organic transparent conducting films such as polyaniline or derivatives thereof, polythiophene or derivatives thereof and the like.

The thickness of the anode can be appropriately selected while considering transmission of a light and electric conductivity, and for example, from 10 nm to 10 µm, preferably from 20 nm to 1 µm, further preferably from 50 nm to 500 nm.

Further, for easy charge injection, there may be provided on the anode a layer comprising a phthalocyanine derivative conducting polymers, carbon and the like, or a layer having an average film thickness of 2 nm or less comprising a metal oxide, metal fluoride, organic insulating material and the like.

As the material of a cathode used in the polymer LED of the present invention, that having lower work function is preferable. For example, there are used metals such as lithium, sodium, potassium, rubidium, cesium, beryllium, magnesium, calcium, strontium, barium, aluminum, scandium, vanadium, zinc, yttrium, indium, cerium, samarium, europium, terbium, ytterbium and the like, or alloys comprising two or more of them, or alloys comprising one or more of them with one or more of gold, silver, platinum, copper, manganese, titanium, cobalt, nickel, tungsten and tin, graphite or graphite intercalation compounds and the like. Examples of alloys include a magnesium-silver alloy, magnesium-indium alloy, magnesium-aluminum alloy, indium-silver alloy, lithium-aluminum alloy, lithium-magnesium alloy, lithium-indium alloy, calcium-aluminum alloy and the like. The cathode may be formed into a laminated structure of two or more layers.

The thickness of the cathode can be appropriately selected while considering transmission of a light and electric conductivity, and for example, from 10 nm to 10 μm, preferably from 20 nm to 1 μm, further preferably from 50 nm to 500 nm.

As the method for fabricating a cathode, there are used a vacuum vapor deposition method, sputtering method, lamination method in which a metal thin film is adhered under heat and pressure, and the like. Further, there may also be provided, between a cathode and an organic layer, a layer comprising an conducting polymer, or a layer having an average film thickness of 2 nm or less comprising a metal oxide, metal fluoride, organic insulation material and the like, and after fabrication of the cathode, a protective layer may also be provided which protects the polymer LED. For stable use of the polymer LED for a long period of time, it is preferable to provide a protective layer and/or protective cover for protection of the device in order to prevent it from outside damage.

As the protective layer, there can be used a polymer compound, metal oxide, metal fluoride, metal borate and the like. As the protective cover, there can be used a glass plate, a plastic plate the surface of which has been subjected to lower-water-permeation treatment, and the like, and there is suitably used a method in which the cover is pasted with an device substrate by a thermosetting resin or light-curing resin for sealing. If space is maintained using a spacer, it is easy to prevent an device from being injured. If an inner gas such as nitrogen and argon is sealed in this space, it is possible to prevent oxidation of a cathode, and further, by placing a desiccant such as barium oxide and the like in the above-described space, it is easy to suppress the damage of an device by moisture adhered in the production process. Among them, any one means or more are preferably adopted.

For obtaining light emission in plane form using the polymer LED of the present invention, an anode and a cathode in the plane form may properly be placed so that they are laminated each other. Further, for obtaining light emission in pattern form, there are a method in which a mask with a window in pattern form is placed on the above-described plane light-emitting device, a method in which an organic layer in non-light emission part is formed to obtain extremely large thickness providing substantial non-light emission, and a method in which any one of an anode or a cathode, or both of them are formed in the pattern. By forming a pattern by any of these methods and by placing some electrodes so that independent on/off is possible, there is obtained a display device of segment type which can display digits, letters, simple marks and the like. Further, for forming a dot matrix device, it may be advantageous that anodes and cathodes are made in the form of stripes and placed so that they cross at right angles. By a method in which a plurality of kinds of polymeric fluorescent substances emitting different colors of lights are placed separately or a method in which a color filter or luminescence converting filter is used, area color displays and multi color displays are obtained. A dot matrix display can be driven by passive driving, or by active driving combined with TFT and the like. These display devices can be used as a display of a computer, television, portable terminal, portable telephone, car navigation, view finder of a video camera, and the like.

Further, the above-described light-emitting device in plane form is a thin self-light-emitting one, and can be suitably used as a sheet light source for back-light of a liquid crystal display, or as a sheet light source for illumination. Further, if a flexible plate is used, it can also be used as a curved light source or a display.

EXAMPLES

The following examples further illustrate the present invention in detail but do not limit the scope thereof.

Herein, regarding the number average molecular weight, a number average molecular weight in terms of polystyrene was measured by gel permeation chromatography (GPC) using chloroform as a solvent.

Example 1

<Synthesis of Polymer Fluorescent Substance 1>

0.244 g (7.3 mmol) of 2-methoxy-5-(2-ethylhexyloxy)-p-xylylene dichloride, 1.83 g (4.5 mmol) of 2,5-bis(chloromethyl)-3'-(3,7-dimethyloctyloxy)biphenyl and 1.63 g (3.9 mmol) of 2-methyl-5-(3,7-dimethyloctyl)-p-xylylene dibromide were dissolved in 660 g of dehydrated 1,4-dioxane. The ratios of the monomers to the total amount of the monomers were 8 mol %, 49 mol % and 43 mol %, respectively. The system was purged with nitrogen by bubbling nitrogen through this solution for 20 minutes, then, the solution was heated up to 95° C. under nitrogen atmosphere. To this solution was added dropwise, over about 10 minutes, a solution prepared previously by dissolving 4.7 g of potassium t-butoxide in 80 g of dehydrated 1,4-dioxane. After the addition, they were polymerized for 2.5 hours at 97° C.

After the polymerization, the polymerized solution was cooled to 50° C., then, neutralized by addition of acetic acid. After cooling to room temperature, this polymerized solution was poured into 800 g of methanol, and the produced precipitate was recovered. This precipitate washed with ethanol, then, dried under reduced pressure. 1.5 g of the resulted polymer was dissolved in 400 g of THF. This solution was poured into 800 g of methanol, and the produced precipitate was recovered. This precipitate washed with ethanol, then, dried under reduced pressure to obtain 1.4 g of a polymer. This polymer is called Polymer fluorescent substance 1. Polymer fluorescent substance 1 had a number-average molecular weight of $2 \times 10^5$.

<Fabrication of Device and Evaluation of Drift Mobility of Carrier>

0.006 g of Polymer fluorescent substance 1 was weighed, to this was added toluene to give 1 g of a mixture, and the mixture was stirred at room temperature to provide complete dissolution. This solution is called a toluene solution of Polymer fluorescent substance 1.

The toluene solution of Polymer fluorescent substance 1 obtained above was cast on a transparent conductive film formed on glass (ITO) to form a film having a thickness of 5.6 μm. Further, an Al electrode was vapor-deposited on the thin film of Polymer fluorescent substance 1, and used as a sample for measuring the drift mobility of carrier. In this sample, positive voltage was applied to the transparent electrode for this Al electrode, and a flush light (wavelength: 481 nm, flush time: 1 nsec) was directed from the transparent electrode side by using a nitrogen laser excitation type pigment laser, to measure the transition light current of hole. The hole drift mobility was calculated from curved point in log-log plot of time-transition light current. Likewise, negative voltage was applied to the transparent electrode for the Al electrode, and a flush light was directed from the transparent electrode side, to measure the transition light current of electron. The electron drift mobility was calculated from curved point in log-log plot of time-transition light current. As a result, at a measuring temperature of 27° C. and an application voltage of 280 V (electric field: 0.5 MV/cm), a hole drift mobility of $1.7 \times 10^{-8}$ cm$^2$/V/s was obtained, and at an application voltage of −280 V (electric field: 0.5 MV/cm), an electron drift mobility of $2.4 \times 10^{-8}$ cm$^2$/V/s was obtained. The drift nobility ratio $\mu_H/\mu_E$ was 0.71. Further, dependency of the hole drift mobility on filed intensity and temperature was measured at an electric field of 0.3 to 1 MV/cm and a temperature of −5° C. to 40° C. At each temperature, $E^{1/2}$ and $\log[\mu(E, T)]$ were plotted using the resulted hole drift mobility $\mu(E, T)$ and electric field E, and approximated linearly by the least square method, to obtain the value $\mu(E \rightarrow 0, T)$ of the section of the line. Then, $1/T^2$ and $\log[\mu(E \rightarrow 0, T)]$ were plotted, and approximated linearly by the least-square method, to give $2 \times 10^{-5}$ cm$^2$/V/s, a value of $\mu_0$ from the section of the line.

<Fabrication of Device and Evaluation of Polymer LED Properties>

A suspension of poly(3,4)ethylenedioxythiophene/polystyrenesulfonic acid (Baytron P AI 4083, manufactured by Bayer) was filtrated through a 0.5 μm membrane filter, then, spin-coated on a glass substrate carrying thereon an ITO film having a thickness of 150 nm formed by a sputtering method, to give a film having a thickness of 70 nm, and dried for 10 minutes at 120° C. in an oven. Then, a light-emitting layer having a thickness of 70 nm was formed by spin-coating a 0.6 wt % toluene solution of Polymer fluorescent substance 1 at room temperature. Further, this was dried for 1 hour at 80° C. under reduced pressure, then, lithium fluoride was deposited to give a thickness of about 0.4 nm, then, calcium was deposited to give a thickness of 40 nm, and aluminum was deposited to give a thickness of 70 nm as a cathode, to fabricate a polymer LED device. The degrees of vacuum in the depositions were all $8 \times 10^{-6}$ Torr or less. When a voltage of 5.0 V was applied on the resulted device, a current of a current density of 11.6 mA/cm$^2$ flowed, and EL light emission of yellow color having a luminance of 680 cd/m$^2$ was observed. In this operation, the light emission efficiency was 5.8 cd/A and the light emission spectrum of the device had a peak at 558 nm. The device was aged at a constant current of 25 mA/cm$^2$ for 1 hour under nitrogen flow, then, driven continuously at a constant current of 25 m/cm$^2$ under nitrogen flow. As a result, a luminance of 700 cd/m$^2$ lowered to the half value over about 470 hours.

Reference Example 1

<Synthesis of Polymer Fluorescent Substance 2>

2.3 g of 2-methoxy-5-(2-ethylhexyloxy)-p-xylylene was dissolved in 400 g of dehydrated 1,4-dioxane. The system was purged with nitrogen by bubbling nitrogen through this solution for 20 minutes. To this solution was added dropwise, over about 30 minutes, a solution prepared previously by dissolving 4.7 g of potassium t-butoxide in 70 ml of dehydrated 1,4-dioxane. After the addition, they were polymerized by maintaining at room temperature for 15 hours.

After the polymerization, the polymerized solution was neutralized by addition of acetic acid. This polymerized solution was poured into 800 g of methanol, and the produced precipitate was recovered. This precipitate washed with methanol, then, dried under reduced pressure to obtain 0.8 g of a polymer. This polymer is called Polymer fluorescent substance 2. Polymer fluorescent substance 2 had a number-average molecular weight of $1 \times 10^5$.

Comparative Example 1

<Fabrication of Device and Evaluation of Drift Mobility of Carrier>

0.006 g of Polymer fluorescent substance 2 was weighed, to this was added toluene to give 1 g of a mixture, and the mixture was stirred at room temperature to provide incomplete dissolution. The mixture was dissolved completely by stirring at 80° C., however, when the solution was cooled to room temperature, it showed gelling, meaning poorer solubility into toluene as compared with Polymer fluorescent substance 1. 0.004 g of Polymer fluorescent substance 2 was weighed, to this was added chloroform to give 1 g of a mixture, and the mixture was stirred at room temperature to provide complete dissolution, giving a 0.4 wt % chloroform solution.

A thin film of Polymer fluorescent substance 2 having a thickness of 3.3 μm was formed in the same manner as in Example 1 except by using chloroform solution, and an Al electrode was deposited and used as a sample for measurement of drift mobility. In this sample, positive voltage or negative voltage was applied to the transparent electrode for this Al electrode, and a flush light was directed from the transparent electrode side, to measure the transition light current of hole and electron. As a result, at a measuring temperature of 27° C. and an applied voltage of 165 V (electric field: 0.5 MV/cm), a hole drift mobility of $4 \times 10^{-6}$ cm$^2$/V/s was obtained. When negative voltage was applied, in transition light log-log plot, curved point was not found during time range wherein an electron drift mobility of $1 \times 10^{-7}$ cm$^2$/V/s or more was obtained, and the electron drift mobility was estimated to $1 \times 10^{-7}$ cm$^2$/V/s or less. In this case, the drift mobility ratio $\mu_H/\mu_E$ ratio was estimated to 40 or more.

Further, dependency of the hole drift mobility on electric field and temperature was measured at an electric field of 0.3 to 1 MV/cm and a temperature of −10° C. to 40° C. At each temperature, $E^{1/2}$ and $\log[\mu(E, T)]$ were plotted using the resulted hole drift mobility $\mu(E, T)$ and electric field E, and approximated linearly by the least-square method, to obtain the value $\mu(E \rightarrow 0, T)$ of the section of the line. Then, $1/T^2$ and $\log[\mu(E \rightarrow 0, T)]$ were plotted, and approximated linearly by the least-square method, to give $7 \times 10^4$ cm$^2$/V/s, a value of $\mu_0$ from the section of the line.

<Fabrication of Device and Evaluation of Polymer LED Properties>

A polymer LED device was produced at room temperature using the chloroform solution of Polymer fluorescent substance 2 by the same manner as in Example 1. When a voltage of 3.2 V was applied on the resulted device, a current of a current density of 11 mA/cm$^2$ flowed, and EL light emission of orange color having a luminance of 129 cd/m$^2$ was observed. In this operation, the light emission efficiency was 1.1 cd/A.

Reference Example 2

<Synthesis of Polymer Fluorescent Substance 3>

0.2 g (0.60 mmol) of 2-methoxy-5-(2-ethylhexyloxy)-p-xylylene dichloride and 12 g (29.5 mmol) of 2,5-bis(chloromethyl)-4'-(3,7-dimethyloctyloxy) biphenyl were dissolved in 2100 g of dehydrated 1,4-dioxane. The ratios of the monomers to the total amount of the monomers were 2 mol %, and 98 mol %, respectively. The system was purged with nitrogen by bubbling nitrogen through this solution for 20 minutes, then, the solution was heated up to 95° C. under nitrogen atmosphere. To this solution was added dropwise, over about 10 minutes, a solution prepared previously by dissolving 15.5 g of potassium t-butoxide in 210 g of dehydrated 1,4-dioxane. After the addition, they were polymerized by maintaining at 97° C. for 2.5 hours.

After the polymerization, the polymerized solution was cooled to 50° C., then, neutralized by addition of acetic acid. After cooling to room temperature, this polymerized solution was poured into 2500 g of deionized water, and the produced precipitate was recovered. This precipitate was washed with methanol, then, dried under reduced pressure. 7 g of the resulted polymer was dissolved in 1500 g of THF. This solution was poured into 2000 g of methanol, and the produced precipitate was recovered. This precipitate was washed with ethanol, then, dried under reduced pressure to obtain 5 g of a polymer. This polymer is called Polymer fluorescent substance 3. Polymer fluorescent substance 3 had a number-average molecular weight of $4 \times 10^5$.

Comparative Example 2

0.006 g of Polymer fluorescent substance 3 was weighed, to this was added toluene to give 1 g of a mixture, and the mixture was stirred at room temperature to provide incomplete dissolution. The mixture was dissolved completely by stirring at 80° C., however, when the solution was cooled to room temperature, it showed gelling, meaning poorer solubility into toluene as compared with Polymer fluorescent substance 1. 0.004 g of Polymer fluorescent substance 3 was weighed, to this was added chloroform to give 1 g of a mixture, and the mixture was stirred at room temperature to provide complete dissolution, giving a 0.4 wt % chloroform solution.

A polymer LED was produced using the chloroform solution of Polymer fluorescent substance 3 instead of the toluene solution of Polymer fluorescent substance 1 in the same manner as in Example 1. When a voltage of 5.0 V was applied on the resulted device, a current of a current density of 3.9 mA/cm$^2$ flowed, and EL light emission of yellow color having a luminance of 320 cd/m$^2$ was observed. In this operation, the light emission efficiency was 8.3 cd/A and the light emission spectrum of the device had a peak at 543, nm. The device was aged at a constant current of 25 mA/cm$^2$ for 1 hour under nitrogen flow, then, driven continuously at a constant current of 25 mA/cm under nitrogen flow. As a result, a luminance of 1200 cd/m$^2$ lowered to the half value over about 43 hours.

Reference Synthesis Example 3

<Synthesis of 1,4-bis(bromomethyl)-2-(dimethyloctylsilyl) benzene>

1.95 g (80.2 mmol) of finely cut magnesium metal was placed in a 200 ml four-necked flask, and 50 ml of anhydrous tetrahydrofuran was further charged. The mixture was heated up to 70° C. while stirring, and 50 ml of a solution of 5 g (27.0 mmol) of 2-bromo p-xylene in anhydrous tetrahydrofuran was added dropwise while caring for steep reaction (reflux). After completion of the addition, it was refluxed for 30 minutes, then, cooled to 40° C., and to this was added 6.7 g (32.4 mmol) of dimethyloctylsilyl chloride while stirring. The solution was again heated and refluxed for 3 hours. The reaction mixture was charged in an aqueous saturated ammonium chloride solution, and extracted (toluene/water) and the organic phase was dried over sodium sulfate. After concentration, the product was purified and isolated by silica gel column chromatography (n-hexane) to obtain 3.19 g of 2-(dimethyloctylsilyl)-p-xylene.

2 g (7.2 mmol) of 2-(dimethyloctylsilyl)-p-xylene was dissolved in 50 ml of carbon tetrachloride, and 2.67 g (15.0 mmol) of N-bromosuccinimide was charged into this while stirring. The mixture was refluxed for 5 hours, and after completion of the reaction, the deposited solid was removed by filtrated, and to the filtrate was added chloroform and the solution washed with water, and the organic phase was dried over sodium sulfate and concentrated. The product was purified and isolated by silica gel column chromatography (n-hexane) to obtain 1.4 g of 1,4-bis(bromomethyl)-2-(dimethyloctylsilyl)benzene.

Example 2

<Synthesis of Polymer Fluorescent Substance 4>

0.41 g (1.0 mmol) of 1,4-bis(chloromethyl)-2-{4'-(3,7-dimethyloctyloxy)phenyl}benzene and 0.368 g (0.86 mmol) of 1,4-bis(bromomethyl)-2-(dimethyloctylsilyl)benzene and 0.0533 g (0.16 mmol) of 2-methoxy-5-(2-ethylhexyloxy)-p-xylylene dichloride were dissolved in 200 g of 1,4-dioxane (dehydrated). The ratios of the monomers to the total amount of the monomers were 49 mol %, 43 mol % and 8 mol %, respectively.

The system was purged with nitrogen by bubbling nitrogen through this solution for 20 minutes, then, the solution was heated up to 95° C. under nitrogen atmosphere. To this solution was added dropwise, over about 10 minutes, a solution prepared previously by dissolving 1.1 g of potassium t-butoxide in 30 ml of 1,4-dioxane (dehydrated) and by babbling a nitrogen gas for nitrogen purge. After the addition, they were subsequently polymerized for 2.5 hours at 95° C. The reaction was conducted in a nitrogen gas atmosphere.

Then, this solution was cooled, then, neutralized by addition of acetic acid. Methanol was added to this solution, and the produced precipitate was recovered. This precipitate washed with ethanol, then, dried under reduced pressure to obtain 0.39 g of a polymer. Then, this precipitate was dissolved in about 110 g of THF, and again precipitated and purified by adding methanol to the solution. The resulted precipitate washed with ethanol, then, dried under reduced pressure to obtain 0.36 g of a polymer. The resulted polymer is called Polymer fluorescent substance 4.

Polymer fluorescent substance 4 had a number-average molecular weight in terms of polystyrene of $9.3 \times 10^4$.

<Fabrication of Device and Evaluation of Polymer LED Properties>

0.0067 g of Polymer fluorescent substance 4 was weighed, to this was added toluene to give 1 g of a mixture, and the mixture was stirred at room temperature to provide complete dissolution. This solution is called a toluene solution of Polymer fluorescent substance 4.

A polymer LED device was fabricated at room temperature using the toluene solution of Polymer fluorescent substance 4 by the same manner as in Example 1. When a voltage of 4.0 V was applied on the resulted device, a current of a current density of 8.1 mA/cm$^2$ flowed, and EL light emission of yellow color having a luminance of 272 cd/m$^2$ was observed. In this operation, the light emission efficiency was 3.4 cd/A and the light emission spectrum of the device had a peak at 564 nm. The device was aged at a constant current of 25 mA/cm² for 1 hour under nitrogen flow, then, driven continuously at a constant current of 25 mA/cm² under nitrogen flow. As a result, the half-life was 230 hours.

Example 3

<Synthesis of Polymer Fluorescent Substance 5>

0.41 g (1.0 mmol) of 1,4-bis(chloromethyl)-2-{4'-(3,7-dimethyloctyloxy)phenyl}benzene and 0.184 g (0.43 mmol) of 1,4-bis(bromomethyl)-2-(dimethyloctylsilyl)benzene, 0.18 g (0.43 mmol) of 2-methyl-5-(3,7-dimethyloctyl)-p-xylylene dibromide and 0.0533 g (0.16 mmol) of 2-methoxy-5-(2-ethylhexyloxy)-p-xylylene dichloride were dissolved in 200 g of 1,4-dioxane (dehydrated). The ratios of the monomers to the total amount of the monomers were 50 mol %, 21 mol %, 21 mol % and 8 mol %, respectively. The system was purged with nitrogen by bubbling nitrogen through this solution for 20 minutes, then, the solution was heated up to 95° C. under nitrogen atmosphere. To this solution was added dropwise, over about 10 minutes, a solution prepared previously by dissolving 1.1 g of potassium t-butoxide in 30 ml of 1,4-dioxane (dehydrated) and by babbling a nitrogen gas for nitrogen purge. After the addition, they were subsequently polymerized for 2 hours at 95° C. The reaction was conducted in a nitrogen gas atmosphere.

Then, this solution was cooled, then, neutralized by addition of acetic acid. Methanol was added to this solution, and the produced precipitate was recovered. This precipitate washed with ethanol, then, dried under reduced pressure to obtain 0.40 g of a polymer. Then, this precipitate was dissolved in about 120 g of THF, and again precipitated and purified by adding methanol to the solution. The resulted precipitate washed with ethanol, then, dried under reduced pressure to obtain 0.36 g of a polymer. The resulted polymer is called Polymer fluorescent substance 5.

Polymer fluorescent substance 5 had a number-average molecular weight in terms of polystyrene of $1.2 \times 10^5$.

<Production and Evaluation of Device>

0.0074 g of Polymer fluorescent substance 5 was weighed, to this was added toluene to give 1 g of a mixture, and the mixture was stirred at room temperature to provide complete dissolution. This solution is called a toluene solution of Polymer fluorescent substance 5.

A polymer LED device was fabricated using the toluene solution of Polymer fluorescent substance 5 by the same manner as in Example 1. When a voltage of 4.0 V was applied on the resulted device, a current of a current density of 5.6 mA/cm² flowed, and EL light emission of yellow color having a luminance of 377 cd/m² was observed. In this operation, the light emission efficiency was 6.7 cd/A and the light emission spectrum of the device had a peak at 560 nm. The device was aged at a constant current of 25 mA/cm² for 1 hour under nitrogen flow, then, driven continuously at a constant current of 25 mA/cm² under nitrogen flow. As a result, the half-life was 250 hours.

A polymer fluorescent substance of the present invention has more excellent solubility into an organic solvent, and when it is used for a polymer LED, higher efficiency and longer life are obtained. Therefore, this polymer LED can be preferably used as a back light of a curved or sheet light source, as a display device of segment type, in apparatuses such as a flat panel display of dot matrix type, and the like.

What is claimed is:

1. A polymer light-emitting device comprising at least one light-emitting layer containing a polymer fluorescent substance, placed between a pair of an anode and a cathode at least one of which is transparent or semi-transparent, wherein, the polymer fluorescent substance emits fluorescence in solid state, has a number-average molecular weight in terms of polystyrene of $1 \times 10^4$ to $1 \times 10^8$, and has each of the repeating units represented by repeating units of the formulae (2), (3) and (4):

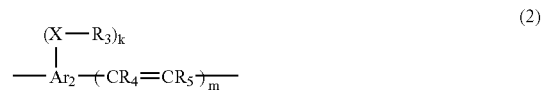

(2)

wherein in the formula (2), $Ar_2$ is an arylene group having 6 to 60 carbon atoms contained in the main chain portion or a divalent heterocyclic compound group having 3 to 60 carbon atoms contained in the main chain portion, X represents an oxygen atom or sulfur atom, $R_3$ represents a group selected from the group consisting of linear, branched or cyclic alkyl groups having 1 to 20 carbon atoms, mono, di or trialkylsilyl groups having 1 to 60 carbon atoms, aryl groups having 6 to 60 carbon atoms, arylalkyl groups having 7 to 60 carbon atoms and heterocyclic compound groups having 3 to 60 carbon atoms, and the aryl group, arylalkyl group and heterocyclic group may also have a substituent, the symbol k is an integer from 1 to 4, each of $R_4$ and $R_5$ independently represents a group selected from the group consisting of a hydrogen atom, linear, branched or cyclic alkyl groups having 1 to 20 carbon atoms, aryl groups having 6 to 60 carbon atoms, heterocyclic compound groups having 3 to 60 carbon atoms and a cyano group, and the aryl group and heterocyclic group may also have a substituent, the symbol m is 0 or 1, $Ar_2$ may have a substituent selected from the group consisting of linear, branched or cyclic alkyl groups having 1 to 20 carbon atoms, mono, di or trialkylsilyl groups having 1 to 60 carbon atoms, mono or dialkylamino groups having 1 to 40 carbon atoms, aryl groups having 6 to 60 carbon atoms, arylalkyl groups having 7 to 60 carbon atoms, arylamino groups having 6 to 60 carbon atoms, heterocyclic compound groups having 3 to 60 carbon atoms and a cyano group, and the aryl group, arylalkyl group, arylamino group and heterocyclic group may further have a substituent, substituents may be the same or different when $Ar_2$ has a plurality of substituents, one or more carbon atoms of the substituent on $Ar_2$ may be substituted with an oxygen atom or sulfur atom, and one or more hydrogen atoms of the substituent on $Ar_2$ may be substituted with a fluorine atom,

(3)

wherein in the formula (3), $Ar_3$ is an arylene group having 6 to 60 carbon atoms contained in the main chain portion or a heterocyclic compound group having 3 to 60 carbon atoms contained in the main chain portion, $Ar_4$ is an aryl group having 6 to 60 carbon atoms or a heterocyclic compound group having 3 to 60 carbon atoms, and may also have a substituent selected from the group consisting of linear, branched or cyclic alkyl groups having 1 to 20 carbon atoms, alkoxy groups having a linear, branched or cyclic alkyl group having 1 to 20 carbon atoms, alkylthio groups having a linear, branched or cyclic alkyl group having 1 to 20 carbon atoms, mono, di or trialkylsilyl groups having 1 to 60 carbon atoms, mono or dialkylamino groups having 1 to 40 carbon atoms, aryl groups having 6 to 60 carbon atoms, aryloxy groups having 6 to 60 carbon atoms, arylalkyl groups having 7 to 60 carbon atoms, arylalkoxy groups having 7 to 60 carbon atoms, arylalkenyl groups having 8 to 60 carbon atoms, arylalkynyl groups having 8 to 60 carbon atoms, arylamino groups having 6 to 60 carbon atoms, heterocyclic compound groups having 3 to 60 carbon atoms and a cyano group, and the aryl group, aryloxy group, arylalkyl group, arylalkoxy group, arylalkenyl group, arylalkynyl group, arylamino group and heterocyclic group may further have a substituent, the symbol n is an integer from 1 to 4, each of $R_6$ and $R_7$ independently represents a group selected from the group consisting of a hydrogen atom, linear, branched or cyclic alkyl groups having 1 to 20 carbon atoms, aryl groups having 6 to 60 carbon atoms, heterocyclic compound groups having 3 to 60 carbon atoms and a cyano group, and the aryl group and heterocyclic group may also have a substituent, the symbol p is 0 or 1, $Ar_3$ may have a substituent selected from the group consisting of linear, branched or cyclic alkyl groups having 1 to 20 carbon atoms, alkoxy groups having a linear, branched or cyclic alkyl group having 1 to 20 carbon atoms, alkylthio groups having a linear, branched or cyclic alkyl group having 1 to 20 carbon atoms, mono, di or trialkylsilyl groups having 1 to 60 carbon atoms, mono or dialkylamino groups having 1 to 40 carbon atoms, aryloxy groups having 6 to 60 carbon atoms, arylalkyl groups having 7 to 60 carbon atoms, arylalkoxy groups having 7 to 60 carbon atoms, arylamino groups having 6 to 60 carbon atoms, and a cyano group, and the aryloxy group, arylalkyl group, arylalkoxy group, arylamino group may further have a substituent, substituents may be the same or different when $Ar_3$ has a plurality of substituents, one or more carbon atoms of the substituents on $Ar_3$ may be substituted with an oxygen atom or sulfur atom, and one or more hydrogen atoms of the substituents on $Ar_3$ may be substituted with a fluorine atom,

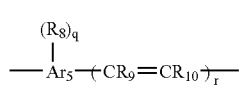

(4)

wherein in the formula (4), $Ar_5$ is an arylene group having 6 to 60 carbon atoms contained in the main chain portion or a divalent heterocyclic compound group having 3 to 60 carbon atoms contained in the main chain portion, $R_8$ represents a group selected from the group consisting of linear, branched or cyclic alkyl groups having 1 to 20 carbon atoms, mono, di or trialkylsilyl groups having 1 to 60 carbon atoms, mono or dialkylamino groups having 1 to 40 carbon atoms, saturated heterocyclic compound groups having 3 to 60 carbon atoms and arylalkyl groups having 7 to 60 carbon atoms, and the arylalkyl group may further have a substituent, the symbol q is an integer from 1 to 4, each of $R_9$ and $R_{10}$ independently represents a group selected from the group consisting of a hydrogen atom, linear, branched or cyclic alkyl groups having 1 to 20 carbon atoms, aryl groups having 6 to 60 carbon atoms, heterocyclic compound groups having 3 to 60 carbon atoms and a cyano group, and the aryl group and heterocyclic group may also have a substituent, the symbol r is 0 or 1, $Ar_5$ may have a substituent selected from the group consisting of alkoxy groups having a linear, branched or cyclic alkyl group having 1 to 20 carbon atoms, alkylthio groups having a linear, branched or cyclic alkyl group having 1 to 20 carbon atoms, aryl groups having 6 to 60 carbon atoms, aryloxy groups having 6 to 60 carbon atoms, arylalkoxy groups having 7 to 60 carbon atoms, arylamino groups having 6 to 60 carbon atoms, heterocyclic compound groups having 3 to 60 carbon atoms and a cyano group, and the aryl group, aryloxy group, arylalkoxy group, arylamino group and heterocyclic group may further have a substituent, substituents may be the same or different when $Ar_5$ has a plurality of substituents, one or more carbon atoms of the substituents on $Ar_5$ may be substituted with an oxygen atom or sulfur atom, and one or more hydrogen atoms of the substituents on $Ar_5$ may be substituted with a fluorine atom, wherein, the total amount of repeating units of the formulae (2), (3) and (4) is 50 mol % or more based on all repeating units, and the amount of repeating units of formula (2) is 0.1 mol % to 30 mol %, the amount of repeating units of formula (3) is 29.9 mol % to 70 mol % and the amount of repeating units of formula (4) is 29.9 mol % to 70 mol %, based on the total amount of repeating units of the formulae (2), (3) and (4).

2. A sheet light source using a polymer light-emitting device according to claim 1.

3. A segment display apparatus using a polymer light-emitting device according to claim 1.

4. A dot matrix display apparatus using a polymer light-emitting device according to claim 1.

5. A liquid crystal display apparatus using a polymer light-emitting device according to claim 1 as a back light.

* * * * *